(12) United States Patent
Ryu et al.

(10) Patent No.: US 11,889,679 B2
(45) Date of Patent: Jan. 30, 2024

(54) SEMICONDUCTOR DEVICES AND METHODS OF FABRICATING THE SAME

(71) Applicant: Samsung Electronics Co., Ltd., Suwon-si (KR)

(72) Inventors: Sungyeon Ryu, Chuncheon-si (KR); Eunjung Kim, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/193,476

(22) Filed: Mar. 5, 2021

(65) Prior Publication Data

US 2022/0045063 A1 Feb. 10, 2022

(30) Foreign Application Priority Data

Aug. 7, 2020 (KR) .................. 10-2020-0099387

(51) Int. Cl.
*H01L 21/762* (2006.01)
*H10B 12/00* (2023.01)
*H01L 49/02* (2006.01)

(52) U.S. Cl.
CPC ............ *H10B 12/30* (2023.02); *H01L 28/60* (2013.01); *H10B 12/033* (2023.02)

(58) Field of Classification Search
CPC ......... H01L 27/10805; H01L 27/10852; H01L 28/60; H01L 27/10814; H01L 27/10876; H01L 27/10885; H01L 27/10888; H01L 27/10891; H01L 21/76224; H01L 21/76232; H01L 21/02164; H01L 21/0217; H01L 21/76229; H01L 21/823481

See application file for complete search history.

(56) References Cited

U.S. PATENT DOCUMENTS

| | | | |
|---|---|---|---|
| 7,153,740 B2 | 12/2006 | Kim et al. | |
| 7,767,565 B2 | 8/2010 | Chung | |
| 8,288,263 B2 | 10/2012 | Kim et al. | |
| 8,802,561 B1 | 8/2014 | Yeh et al. | |
| 9,318,369 B2 | 4/2016 | Park | |
| 9,496,397 B2 | 11/2016 | Ching et al. | |
| 10,115,640 B2 | 10/2018 | Hwang et al. | |
| 10,115,721 B2 | 10/2018 | Hafez et al. | |
| 10,395,973 B2 | 8/2019 | Kim et al. | |
| 10,522,679 B2* | 12/2019 | Jha ...................... H01L 29/0649 | |
| 2004/0032006 A1* | 2/2004 | Yun .................... H01L 21/76229 | 438/258 |
| 2010/0295147 A1* | 11/2010 | Wu .................... H01L 21/76232 | 257/E21.546 |
| 2019/0096997 A1 | 3/2019 | More et al. | |
| 2020/0052114 A1 | 2/2020 | Cheng et al. | |
| 2020/0075397 A1* | 3/2020 | Chen ................... H01L 21/0228 | |
| 2020/0075614 A1* | 3/2020 | Huang ............. H01L 29/42332 | |
| 2020/0091336 A1 | 3/2020 | Bu et al. | |

* cited by examiner

*Primary Examiner* — David Vu
(74) *Attorney, Agent, or Firm* — Harness, Dickey & Pierce, P.L.C.

(57) ABSTRACT

Disclosed are a semiconductor device and a method of fabricating the same. In the semiconductor device, a supporting pattern may be used to fix upper portions of active patterns, when a gap-filling process is performed to fill a region between active patterns, and thus, it may be possible to prevent or reduce the likelihood of the active patterns from being bent or fallen. Thus, it may be possible to reduce failure of the semiconductor device and/or to improve reliability of the semiconductor device.

16 Claims, 47 Drawing Sheets

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2020-0099387, filed on Aug. 7, 2020, in the Korean Intellectual Property Office, the entire contents of which are hereby incorporated by reference.

BACKGROUND

Some example embodiments relate to semiconductor devices and/or methods of fabricating the same, and in particular, to semiconductor devices including field effect transistors and/or methods of fabricating the same.

A semiconductor device includes an integrated circuit including metal-oxide-semiconductor field-effect transistors (MOSFETs). To meet an increasing demand for the semiconductor device with a small pattern size and a reduced design rule, the MOSFETs are being scaled down. The scale-down of the MOSFETs may lead to deterioration in operational properties of the semiconductor device. A variety of studies are being conducted to overcome technical limitations associated with the scale-down of the semiconductor device and to realize high performance semiconductor devices.

SUMMARY

Some example embodiments of inventive concepts provide a semiconductor device with improved reliability and a method of fabricating the same.

According to some example embodiments of inventive concepts, a semiconductor device may include a substrate having a plurality of trenches, an insulating pattern covering bottom surfaces of the plurality of trenches and inner side surfaces of the plurality of trenches, and active patterns defined by the plurality of trenches. The active patterns are spaced apart from each other in a first direction and are parallel to each other, the first direction parallel to a top surface of the substrate, and at least one of opposite topmost ends of the active patterns has a stepwise portion.

According to some example embodiments of inventive concepts, a semiconductor device may include a substrate having a plurality of trenches, the plurality trenches including first trenches and second trenches having widths different from each other, active patterns defined by the plurality of trenches, an oxide layer covering an inner surface of each of the first trenches and the second trenches, and a nitride layer filling the second trenches. At least one of opposite topmost ends of the active patterns has a stepwise portion, the oxide layer is interposed between inner side surfaces of the second trenches and a side surface of the nitride layer, and the oxide layer is interposed between bottom surfaces of the second trenches and a bottom surface of the nitride layer.

According to some example embodiments of inventive concepts, a method of fabricating a semiconductor device may include forming a plurality of trenches in a substrate, the plurality of trenches defining active patterns between the plurality of trenches, forming a protection layer to conformally cover top surfaces of the active patterns and to cover bottom surfaces of the plurality of trenches and inner side surfaces of the plurality of trenches, forming a sacrificial layer to fill remaining portions of the plurality of trenches, forming supporting patterns to cover a portion of the protection layer and to cover the sacrificial layer, forming a protection pattern between the supporting pattern and the active patterns, removing the sacrificial layer, filling a lower oxide layer to fill the portions of the plurality of trenches from which the sacrificial layer is removed, removing the supporting pattern, and forming an upper oxide layer to cover the protection pattern and the lower oxide layer.

BRIEF DESCRIPTION OF THE DRAWINGS

Some example embodiments will be more clearly understood from the following brief description taken in conjunction with the accompanying drawings. The accompanying drawings represent some non-limiting, example embodiments as described herein.

It should be noted that these figures are intended to illustrate the general characteristics of methods, structure and/or materials utilized in certain example embodiments and to supplement the written description provided below. These drawings are not or not necessarily, however, to scale and may not precisely reflect the precise structural and/or performance characteristics of any given embodiment, and should not be interpreted as defining or limiting the range of values or properties encompassed by some example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF SOME EXAMPLE EMBODIMENTS

Some embodiments of inventive concepts will now be described more fully with reference to the accompanying drawings, in which example embodiments are shown.

FIGS. 1A to 14A are plan views illustrating a portion of a semiconductor device to describe a method of fabricating a semiconductor device according to some example embodiments of inventive concepts. FIGS. 1B to 14B are sectional views respectively taken along lines I-I' of FIGS. 1A to 14A. FIGS. 10C to 14C are sectional views respectively taken along lines II-II' of FIGS. 10A to 14A.

Figure 1A:
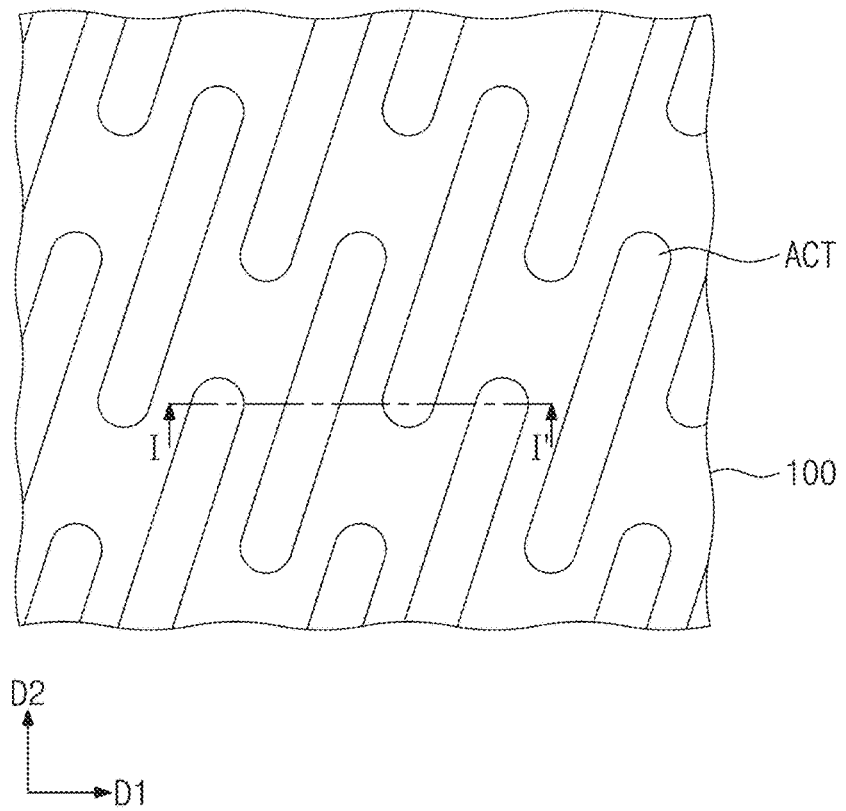
FIGS. 1A, 2A, 3A, 4A, 5A, 6A, 7A, 8A, 9A, 10A, 11A, 12A, 13A, and 14A are plan views illustrating a portion of a semiconductor device to describe a method of fabricating a semiconductor device according to some example embodiments of inventive concepts.
Figure 1B:
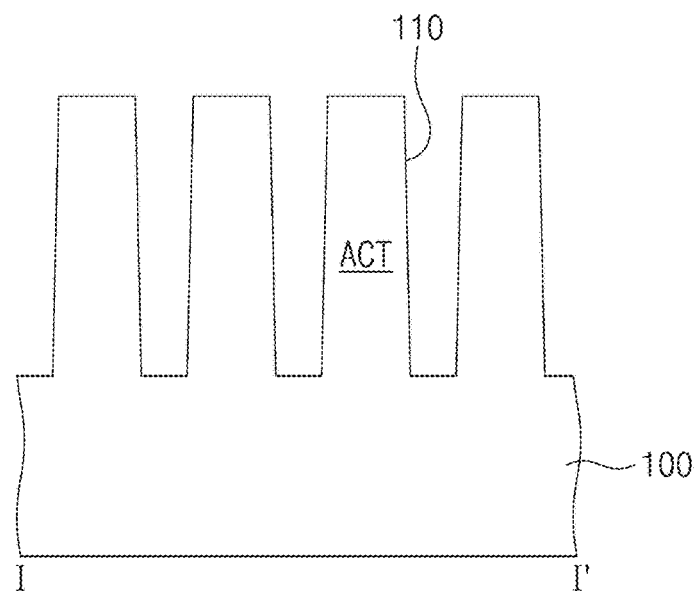
FIGS. 1B, 2B, 3B, 4B, 5B, 6B, 7B, 8B, 9B, 10B, 11B, 12B, 13B, and 14B are sectional views respectively taken along lines I-I' of FIGS. 1A, 2A, 3A, 4A, 5A, 6A, 7A, 8A, 9A, 10A, 11A, 12A, 13A, and 14A.

Referring to FIGS. 1A and 1B, a substrate 100 may be provided. The substrate 100 may include a cell region, in which memory cells will be formed. The substrate 100 may be or include a semiconductor substrate. For example, the substrate 100 may be a silicon substrate, a germanium substrate, or a silicon germanium substrate. The substrate 100 may be doped, e.g. may be lightly doped with P-type impurities such as boron. The substrate 100 may include a plurality of first trenches 110. The first trenches 110 may be formed to be spaced apart from each other in a first direction D1 parallel to a top surface of the substrate 100. The first trenches 110 may be formed by an etching process, such as a reactive ion etching (RIE) process, using a mask pattern such as a soft mask pattern including photoresist and/or a hard mask pattern (not shown). Active patterns ACT may be defined between adjacent ones of the first trenches 110. The first trenches 110 may be formed to expose side surfaces of the active patterns ACT. The active patterns ACT may correspond to islands having a long first axis and a short second axis. The long first axis may extend and intersect the first direction D1 at an angle, for example at an angle of between 45 degrees and 89 degrees, such as at an angle of 70 degrees; however, example embodiments are not limited thereto. In some example embodiments, the active patterns ACT may correspond to active patterns for dynamic random access memory (DRAM) devices; however, example embodiments are not limited thereto.

In some example embodiments, the etching process may include a lithography process, in which an extreme ultraviolet (EUV) light is used. As used herein, the extreme ultraviolet light may have a wavelength of 4 nm to 124 nm (in particular, 4 nm to 20 nm and in more particular, 13.5 nm). The extreme ultraviolet may have an energy of 6.21 eV to 124 eV (in particular, 90 eV to 95 eV). In detail, the EUV lithography process may include an exposure step of irradiating the EUV light onto a photoresist layer, and a developing step. The photoresist layer may be formed of or include a photosensitive compound and a synthetic resin, which can be exposed and developed in the EUV lithography process. The photoresist layer may be formed of or include a material having high EUV absorptivity and, for example, may include at least one of organometallic materials, organic solvents, iodine-containing materials, or fluorine-containing materials. The photoresist layer may be formed, e.g. may be deposited onto (spun onto) the substrate 100, to have a relatively small thickness. Photoresist patterns may be formed by developing the photoresist layer exposed by the EUV light. When viewed in a plan view, each of the photoresist patterns may be a linear pattern extending in a specific direction or may have at least one of an island shape, a zigzag shape, a honeycomb shape, or a circular shape, but inventive concepts are not limited to these examples. According to some example embodiments of inventive concepts, the active patterns ACT of small pitches may be formed by performing the EUV lithography process, and may not be formed by multi patterning technologies (MPT) (e.g., double patterning technology (DPT) and/or quadruple patterning technology (QPT)). For example, in some example embodiments, the active patterns ACT may be formed to have the smallest pitch of 45 nm or less. By using the EUV lithography process, it may be possible to reduce a thickness of the photoresist layer, and thereby to form the active patterns ACT in an accurate and/or fine manner.

Figure 2A:
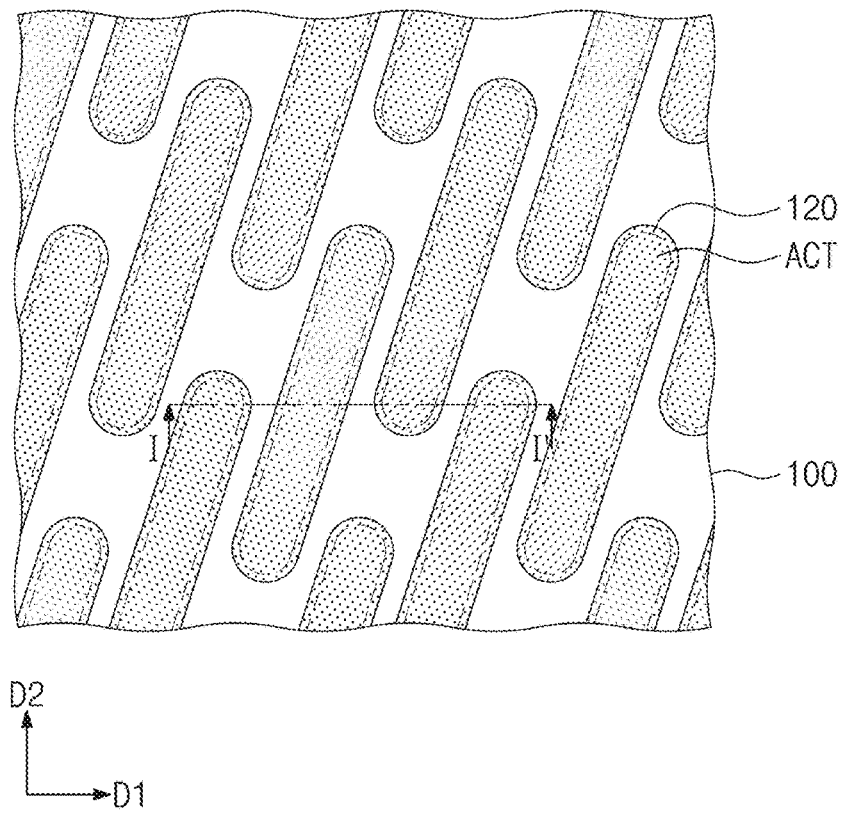
Figure 2B:
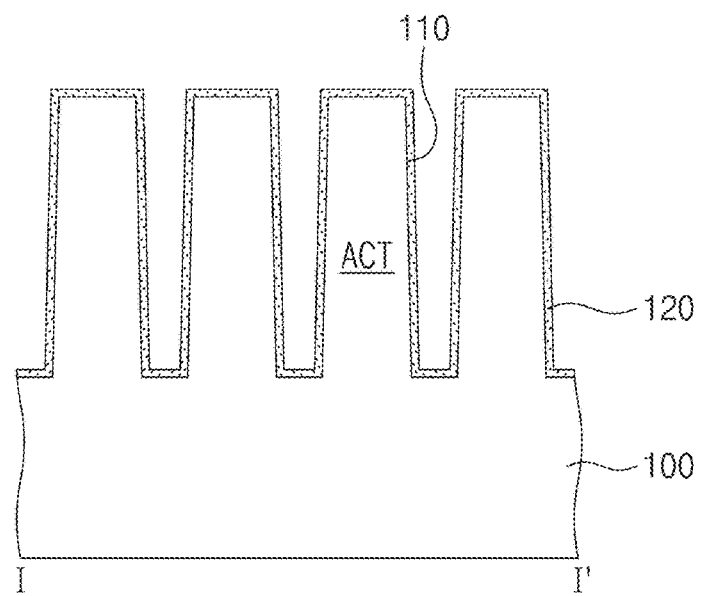

Referring to FIGS. 2A and 2B, a protection layer 120 may be formed on the substrate 100 to cover the active patterns ACT. The protection layer 120 may be formed to conformally cover top surfaces of the active patterns ACT. The protection layer 120 may also be formed to conformally cover bottom surfaces and inner side surfaces of each of the first trenches 110. The protection layer 120 may be formed by, for example, a chemical vapor deposition process and/or an atomic layer deposition process. The protection layer 120 may be formed of or include doped or undoped polysilicon.

Figure 3A:
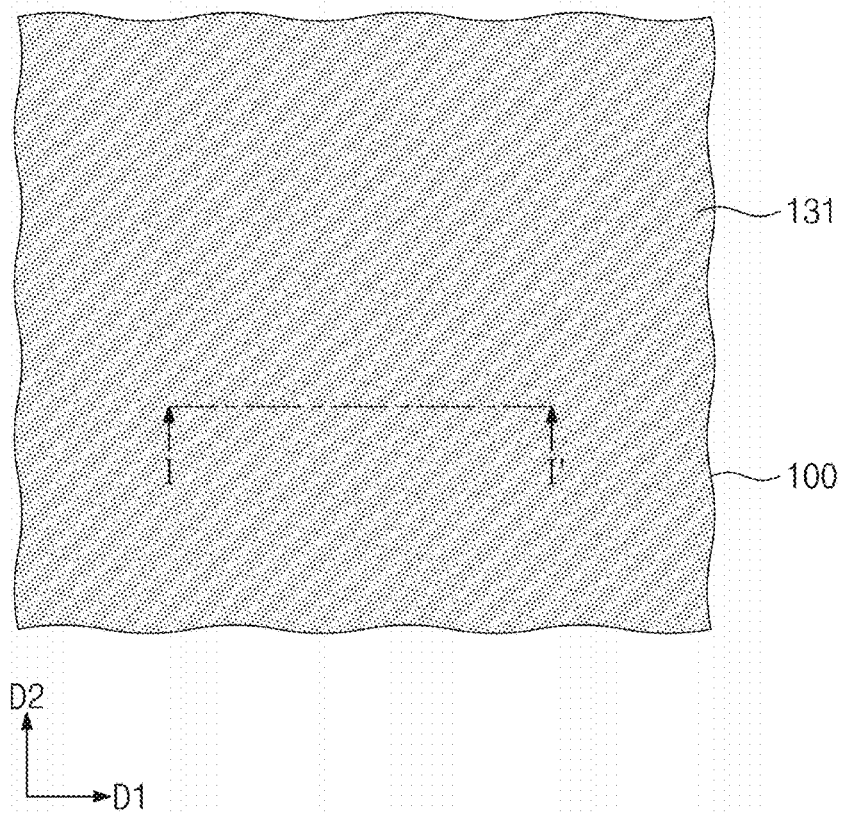
Figure 3B:
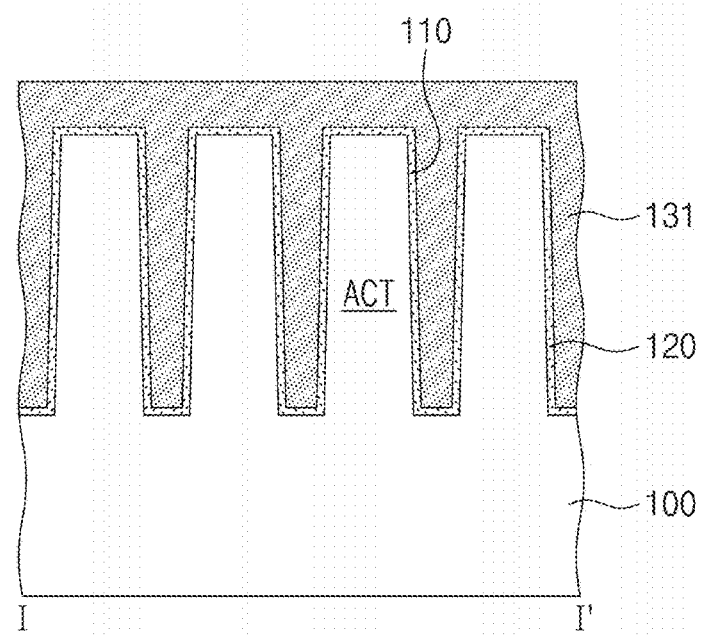

Referring to FIGS. 3A and 3B, a first sacrificial layer 131 may be formed on the protection layer 120. The first sacrificial layer 131 may be formed to fill remaining portions of the first trenches 110. The first sacrificial layer 131 may be formed by, for example, a chemical vapor deposition process and/or an atomic layer deposition process. The first sacrificial layer 131 may be formed of or include a carbon-containing material. For example, the first sacrificial layer 131 may include a spin-on-hardmask (SOH) layer.

Figure 4A:
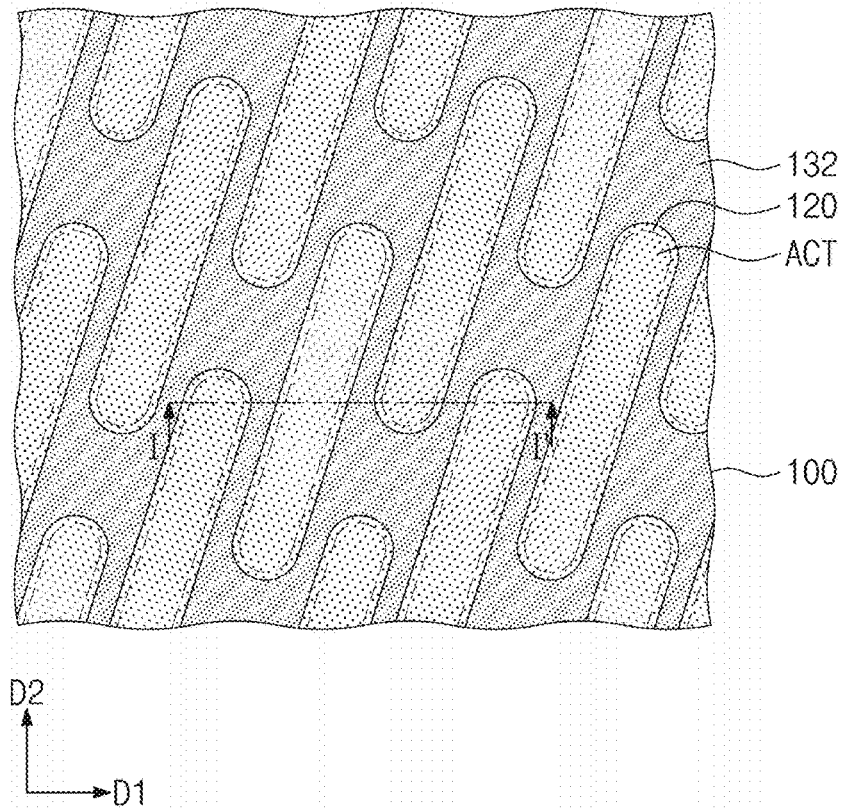
Figure 4B:
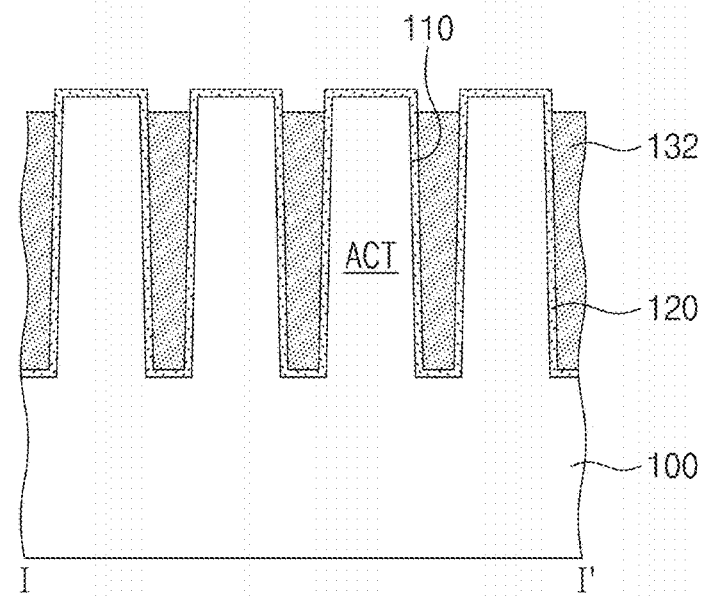

Referring to FIGS. 4A and 4B, the first sacrificial layer 131 may be etched, e.g. at least partially etched, to form a first sacrificial pattern 132. The first sacrificial pattern 132 may be locally formed in each of the first trenches 110. The top surface and portions of the side surfaces of the protection layer 120 may be exposed as a result of the etching process on the first sacrificial layer 131. The first sacrificial pattern 132 may be formed by, for example, an etch-back process such as a blanket etch-back process that exposes the entirety of the top of the substrate 100 to an etching chemical.

Figure 5A:
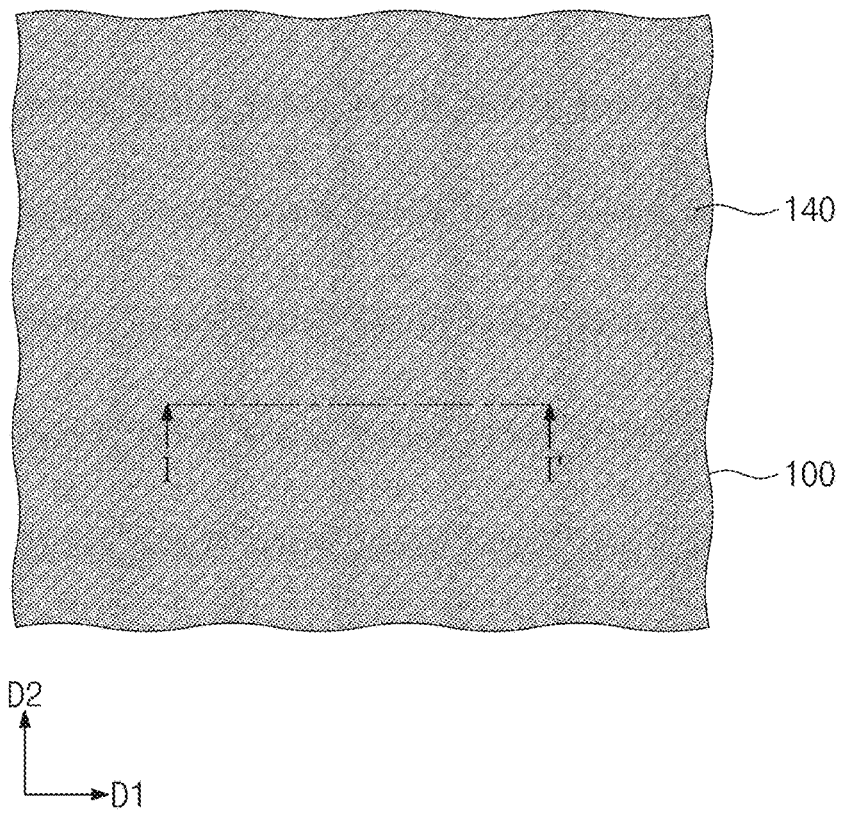
Figure 5B:
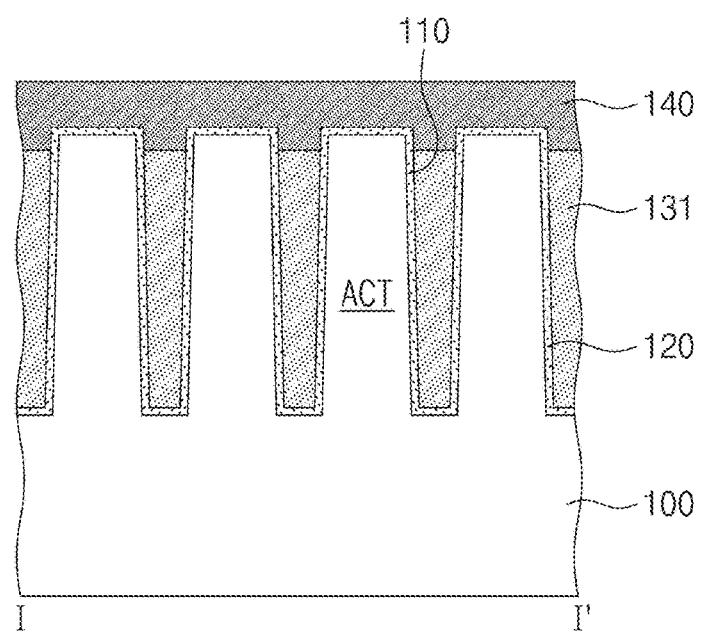

Referring to FIGS. 5A and 5B, a supporting layer 140 may be formed on the first sacrificial pattern 132 and the protection layer 120. The supporting layer 140 may be formed to cover the first sacrificial pattern 132 and the protection layer 120. The supporting layer 140 may be formed by, for example, a chemical vapor deposition process and/or an atomic layer deposition process. The supporting layer 140 may be formed of or include a silicon-containing material. For example, the supporting layer 140 may include a silicon nitride (SiN) layer.

Figure 6A:
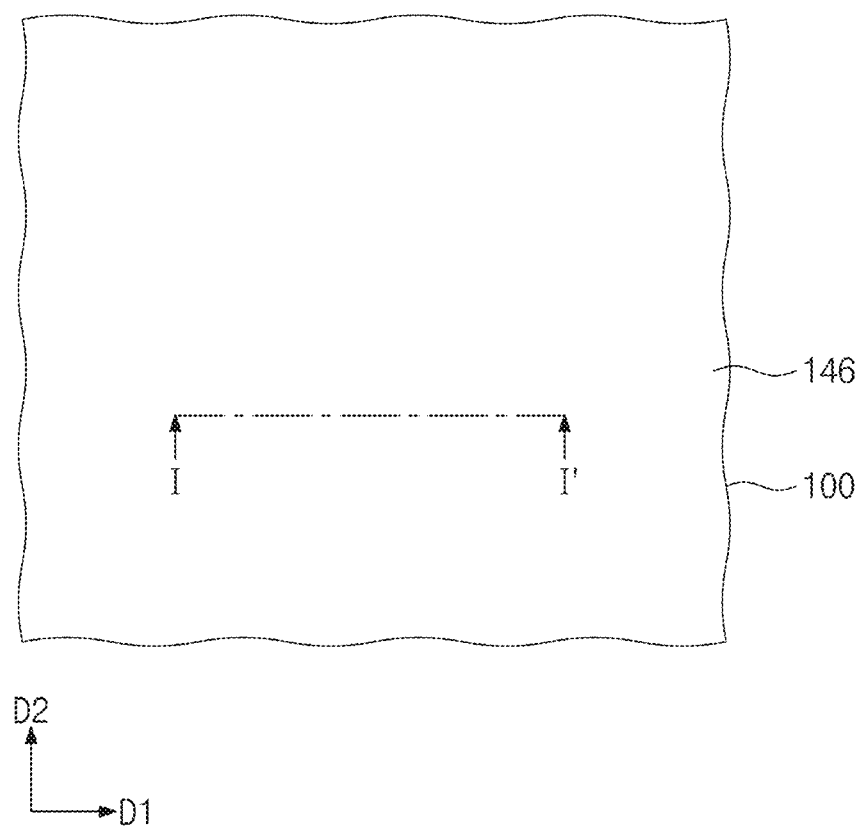
Figure 6B:
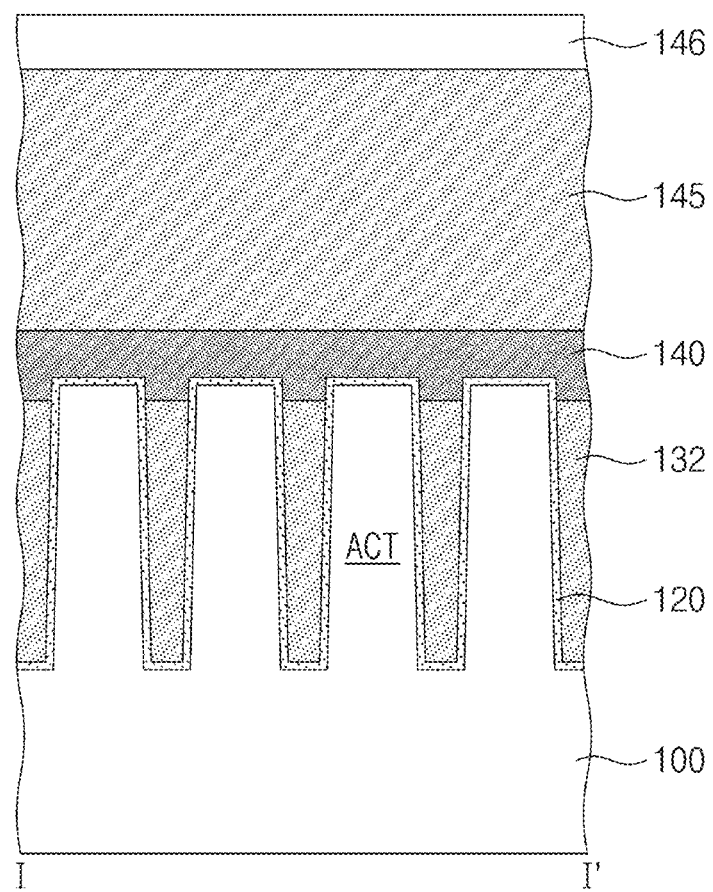

Referring to FIGS. 6A and 6B, a second sacrificial layer 145 and a third sacrificial layer 146 may be sequentially stacked on the supporting layer 140. The second sacrificial layer 145 and the third sacrificial layer 146 may be formed by, for example, a chemical vapor deposition process and/or an atomic layer deposition process. The second sacrificial layer 145 may be formed of or include a carbon-containing material. For example, the second sacrificial layer 145 may include a spin-on-hardmask (SOH) layer. The third sacrificial layer 146 may be formed of or include a silicon-containing material. For example, the third sacrificial layer 146 may be formed of or include silicon oxynitride (SiON) and/or plasma-enhanced SiON (PE-SiON).

Figure 7A:
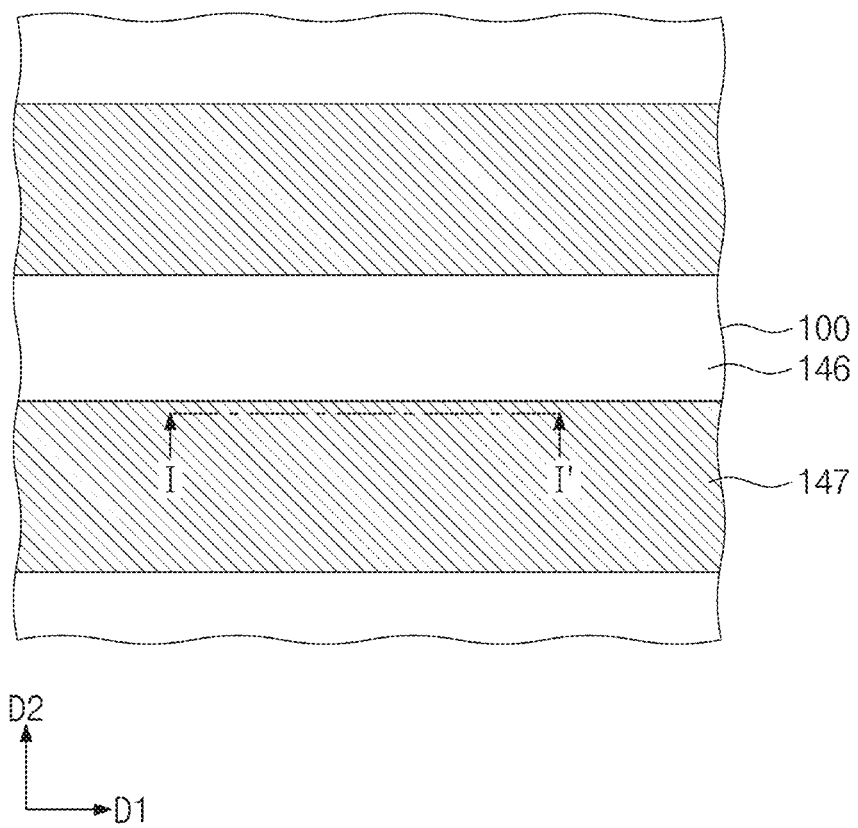
Figure 7B:
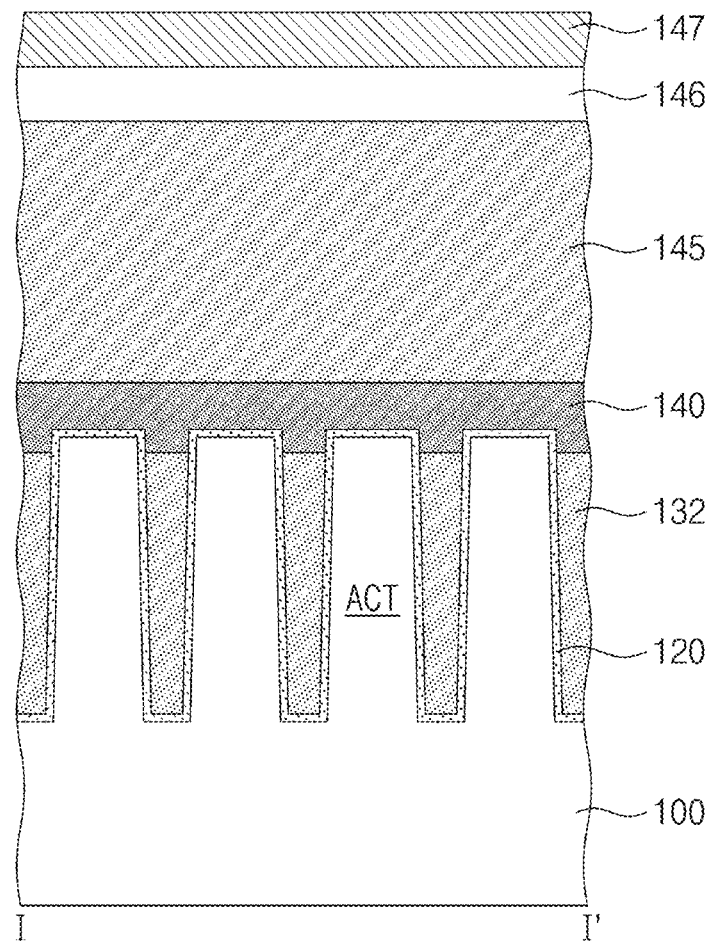

Referring to FIGS. 7A and 7B, mask patterns 147 may be formed on the third sacrificial layer 146. The mask patterns 147 may be formed to cover portions of the third sacrificial layer 146. When viewed in a plan view, each of the mask patterns 147 may be a rectangular pattern. The mask patterns 147 may be formed to be spaced apart from each other in a second direction D2, which is parallel to the top surface of the substrate 100 and is perpendicular to the first direction D1. The mask patterns 147 may be formed of or include photoresist and may be deposited, e.g. may be spun, onto top surfaces of the sacrificial layer 146. Alternatively or additionally, the mask patterns 147 may be formed of or include a hardmask pattern, and may be formed with an ALD process and/or a CVD process.

Figure 8A:
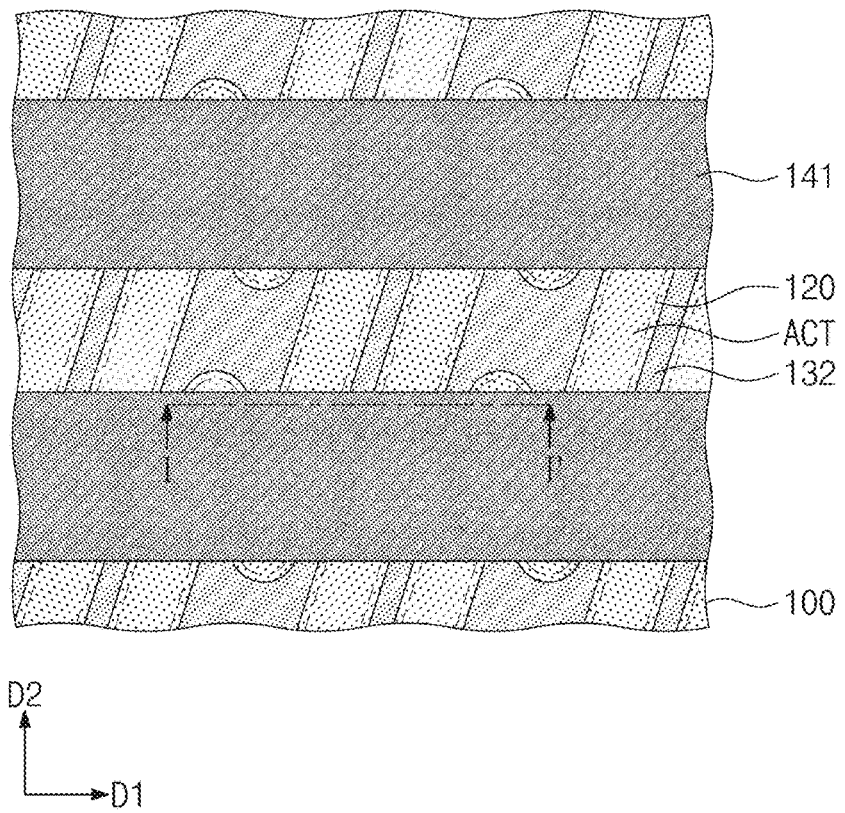
Figure 8B:
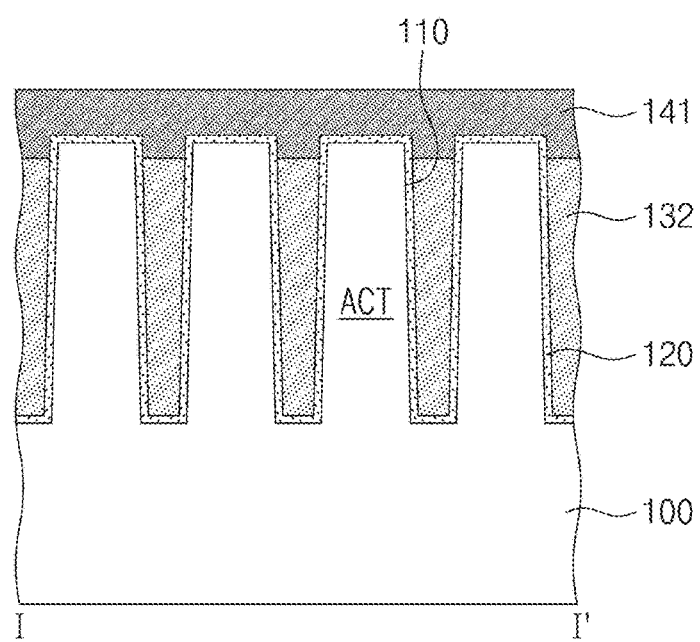

Referring to FIGS. 8A and 8B, a supporting pattern 141 may be formed on the first sacrificial pattern 132 and the protection layer 120 by an etching process using the mask patterns 147. The formation of the supporting pattern 141 may include etching the second sacrificial layer 145, the third sacrificial layer 146, and the supporting layer 140 using the mask patterns 147 as an etch mask. The formation of the supporting pattern 141 may further include removing a remaining portion of the second sacrificial layer 145 and a remaining portion of the third sacrificial layer 146, after the etching process. The remaining portion of the second sacrificial layer 145 and the remaining portion of the third sacrificial layer 146 may be removed by an ashing process and/or a strip process such as an O2 ashing process. The formation of the supporting pattern 141 may include performing a wet etching process using an etching solution (e.g., a solution containing an etchant such as, but not limited to, phosphoric acid). When viewed in a plan view, the supporting pattern 141 may be a plurality of rectangular patterns. When viewed in a plan view, the supporting pattern 141 may be a rectangular pattern elongated in the first direction D1. When viewed in a plan view, the supporting pattern 141 may be formed to cover opposite edge portions of each of the active patterns ACT. The supporting pattern 141 may be formed to fill upper portions of the first trenches 110.

Figure 9A:
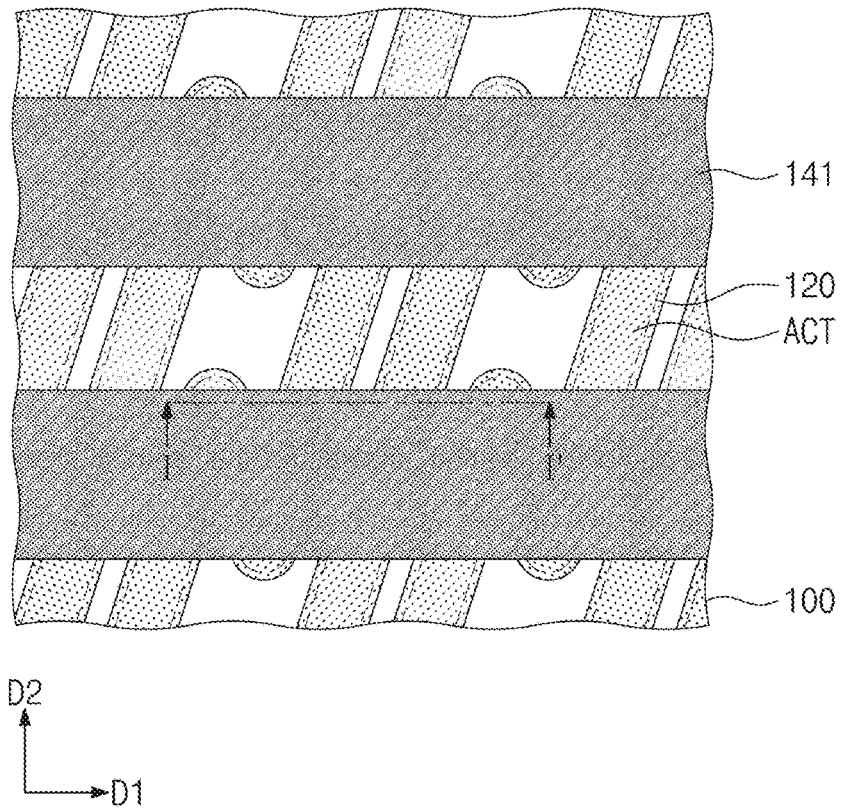
Figure 9B:
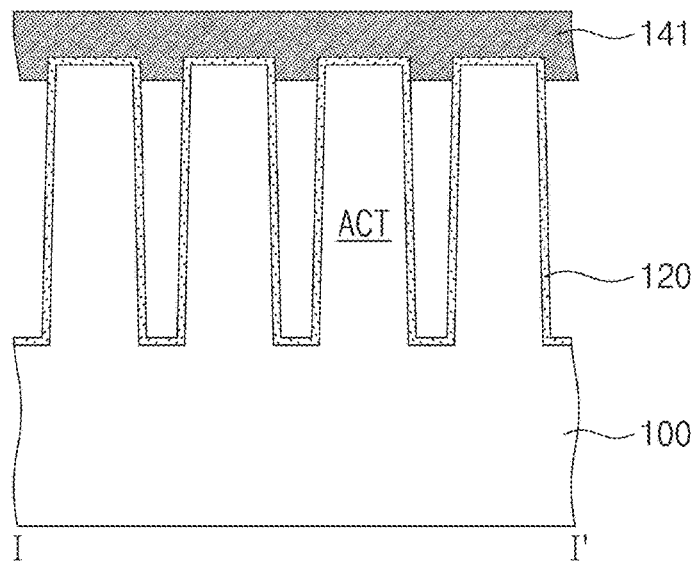

Referring to FIGS. 9A and 9B, the first sacrificial pattern 132 may be removed. In some example embodiments, the first sacrificial pattern 132 may be removed by an ashing process and/or a strip process such as a process using an O2 flash strip. The bottom surface of the protection layer 120 may be exposed during the removing of the first sacrificial pattern 132. Additionally or alternatively, the first sacrificial pattern 132 may be removed with a wet etching process.

Figure 10A:
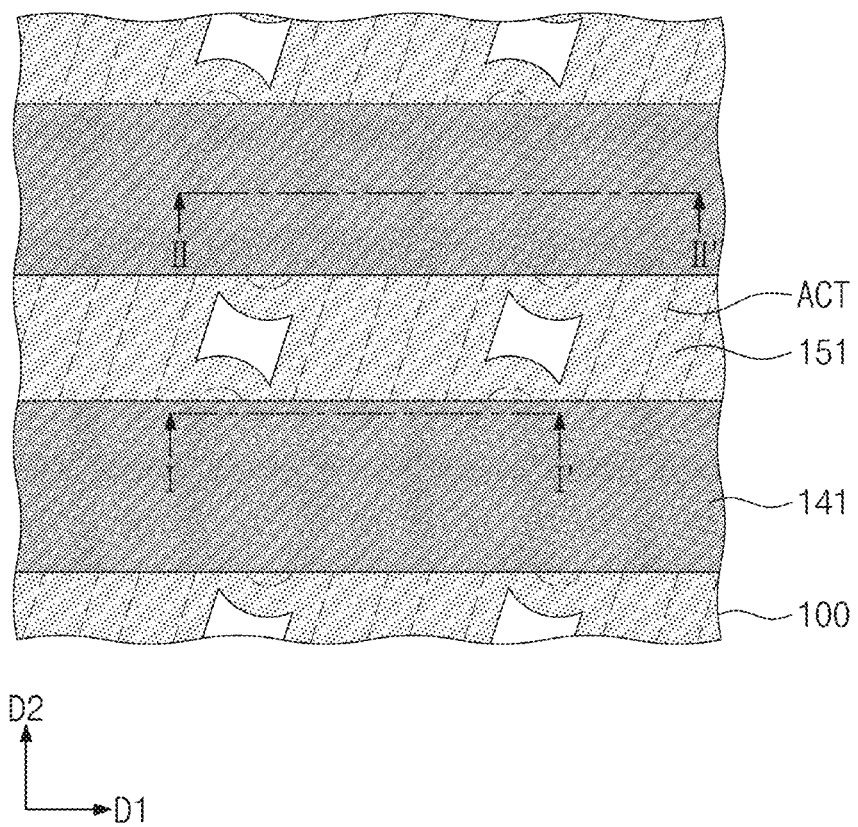
Figure 10B:
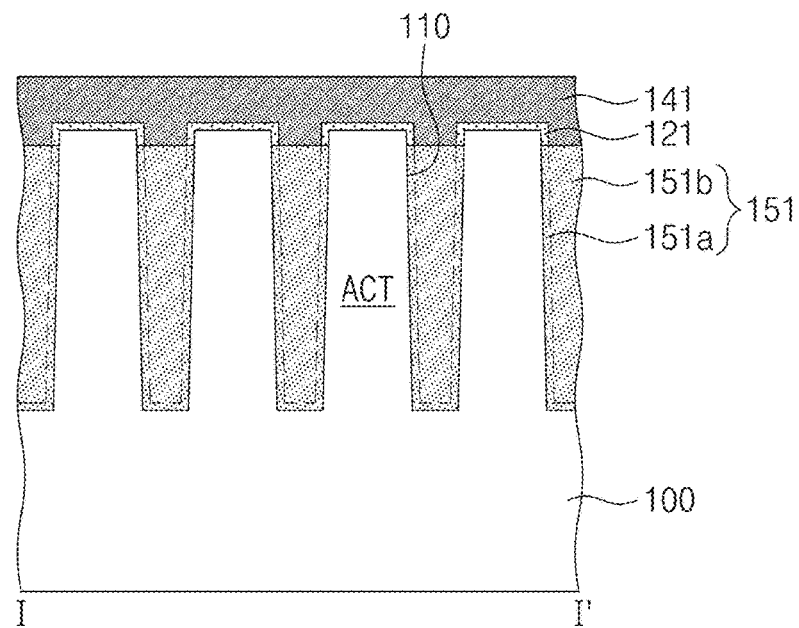
Figure 10C:
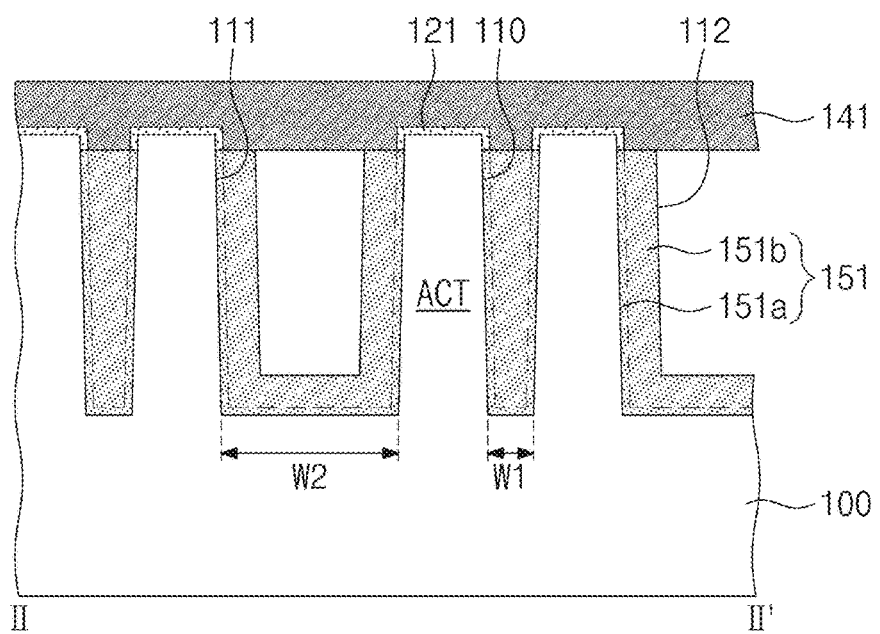
FIGS. 10C 11C, 12C, 13C, and 14C are sectional views respectively taken along lines II-II' of FIGS. 10A, 11A, 12A, 13A, and 14A.

Referring to FIGS. 10A, 10B, and 10C, the substrate 100 may further include second trenches 111 having larger widths than the first trenches 110, in addition to the first trenches 110. As an example, a second width W2 of the bottom surfaces of the second trenches 111 in the first direction D1 may be larger than a first width W1 of the bottom surfaces of the first trenches 110 in the first direction D1. The supporting pattern 141 may fill upper portions of the first and second trenches 110 and 111, even when the first sacrificial pattern 132 is removed. A lower oxide layer 151 may be formed in the first and second trenches 110 and 111. The protection layer 120 may be partially oxidized by an oxidation process, which is performed to form the lower oxide layer 151. The protection layer 120 on the bottom and inner side surfaces of the first and second trenches 110 and 111 may be oxidized by the oxidation process, and as a result, a first lower oxide layer 151*a* may be formed. The first lower oxide layer 151*a* may be formed by exposing polysilicon included in the protection layer 120 to oxygen (O2), causing a reaction (e.g. an oxidation) of the polysilicon to form silicon oxide (SiO2). An unoxidized portion of the protection layer 120, which will be referred to as a protection pattern 121, may be left between the supporting pattern 141 and the active patterns ACT. The oxidation process may be an oxidation treatment process, in which plasma is used. Alternatively or additionally, the oxidation process may include a thermal oxidation process in which plasma is not used. For example, the oxidation process may be or include an in-situ steam generation (ISSG) process and/or a low pressure chemical vapor deposition (LPCVD) process; however, example embodiments are not limited thereto. The supporting pattern 141 may not be oxidized by the oxidation treatment process. The protection pattern 121 covered with the supporting pattern 141 may not be also oxidized. For example, the protection pattern 121 covered by the supporting pattern 141 may not be exposed to oxygen or may be minimally exposed to oxygen, and may be prevented from, or reduced in likelihood of, oxidizing.

The formation of the lower oxide layer 151 may further include forming a second lower oxide layer 151*b* to fill the remaining portions of the first trenches 110 and portions of the second trenches 111. The forming the second lower oxide layer 151*b* may be associated with the quadratic growth model of oxidation given by the Deal-Grove model. The first lower oxide layer 151*a* and the second lower oxide layer 151*b* may be formed of, include, or consist of the same material. The first lower oxide layer 151*a* and the second lower oxide layer 151*b* may be referred to as the lower oxide layer 151. The lower oxide layer 151 may be formed to partially fill the second trenches 111 whose width in the first direction D1 is larger than that of the first trenches 110. The lower oxide layer 151 may be formed to conformally cover the bottom and inner side surfaces of the second trenches 111. Since the lower oxide layer 151 is formed to partially fill the second trenches 111, third trenches 112 may be respectively formed in the second trenches 111. Each of the third trenches 112 may be or correspond to an empty region that is formed in a corresponding one of the second trenches 111. The lower oxide layer 151 may be formed by, for example, at least one of a thermal oxidation process, a chemical vapor deposition process, or an atomic layer deposition process. The lower oxide layer 151 may be formed of or include an oxide material. For example, the lower oxide layer 151 may be formed of or include silicon oxide (SiO2).

Figure 11A:
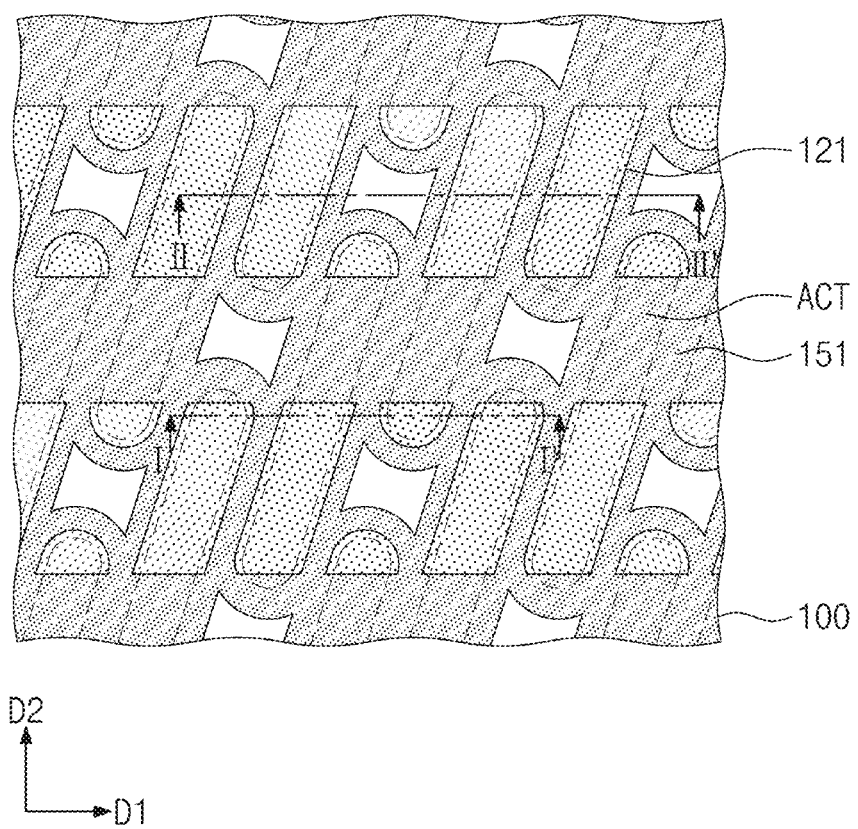
Figure 11B:
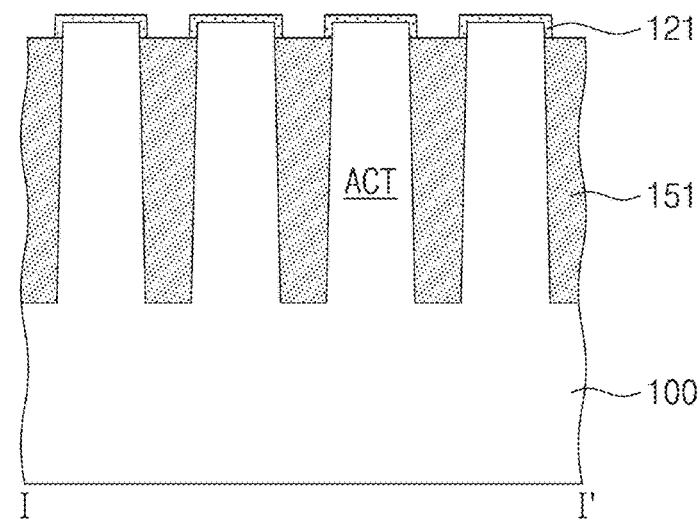
Figure 11C:
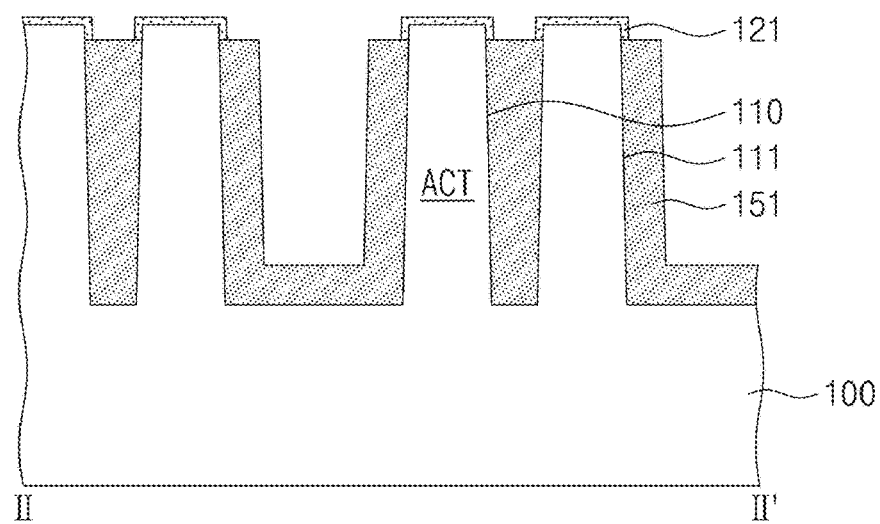

Referring to FIGS. 11A, 11B, and 11C, the supporting pattern 141 may be removed. The removing of the supporting pattern 141 may include performing a dry etching process and/or a wet etching process using an etching solution (e.g., phosphoric acid). The etching solution may have a high etch rate for the material of the supporting pattern 141 (e.g. silicon nitride), and a relatively lower etch rate for the material of the protection pattern 121 (e.g. polysilicon). As a result of the removal of the supporting pattern 141, the protection pattern 121 may be exposed.

Figure 12A:
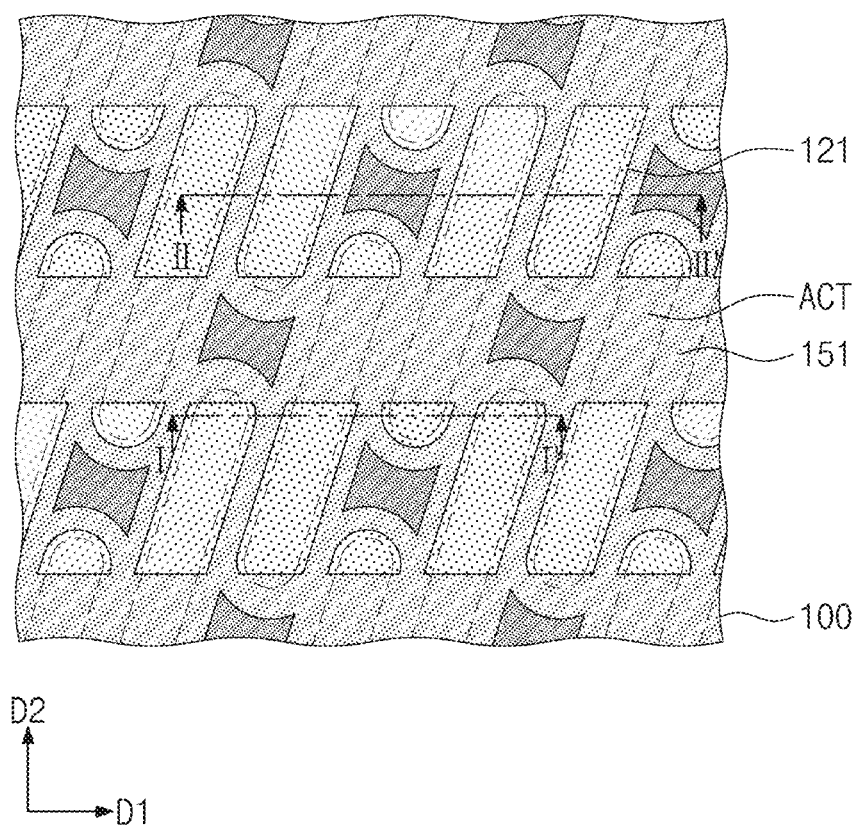
Figure 12B:
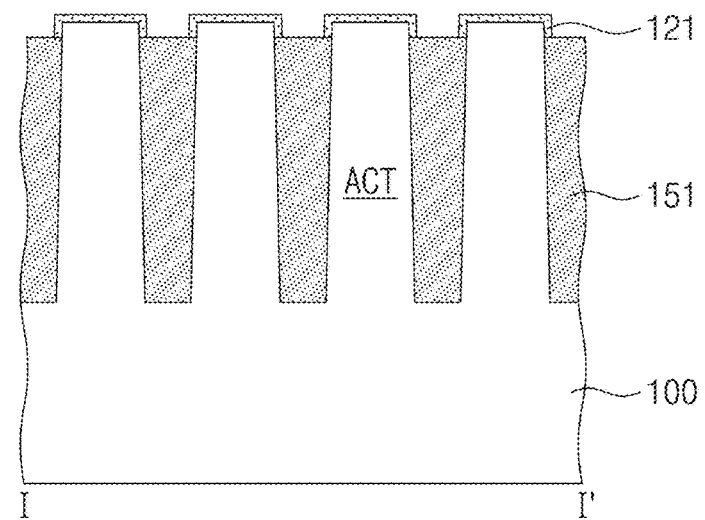
Figure 12C:
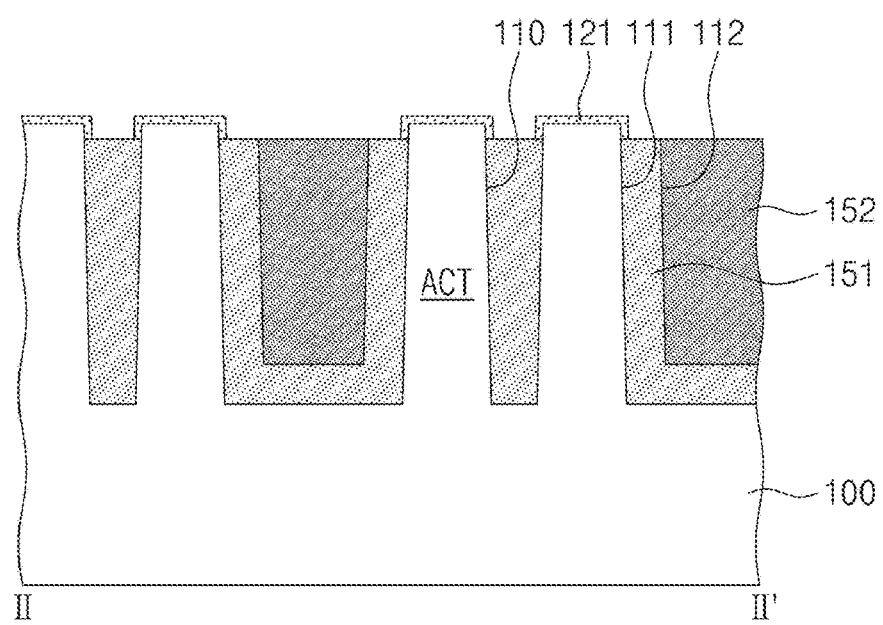

Referring to FIGS. 12A, 12B, and 12C, a nitride layer 152 may be formed to fill the third trenches 112. The nitride layer 152 may be formed to fully fill the third trenches 112. The lower oxide layer 151 may be interposed between the inner side surfaces of the second trenches 111 and the side surface of the nitride layer 152 and between the bottom surfaces of the second trenches 111 and the bottom surface of the nitride layer 152. The nitride layer 152 may be formed by, for example, a chemical vapor deposition process and/or an atomic layer deposition process. The nitride layer 152 may be formed of, include, or consist of a material different from the lower oxide layer 151. The nitride layer 152 may be formed of or include a nitride-containing material. For example, the nitride layer 152 may include a silicon nitride layer (SiN). The nitride layer 152 may initially fill all of the third trenches 112 and then may be etched and/or recessed; however, example embodiments are not limited thereto.

Figure 13A:
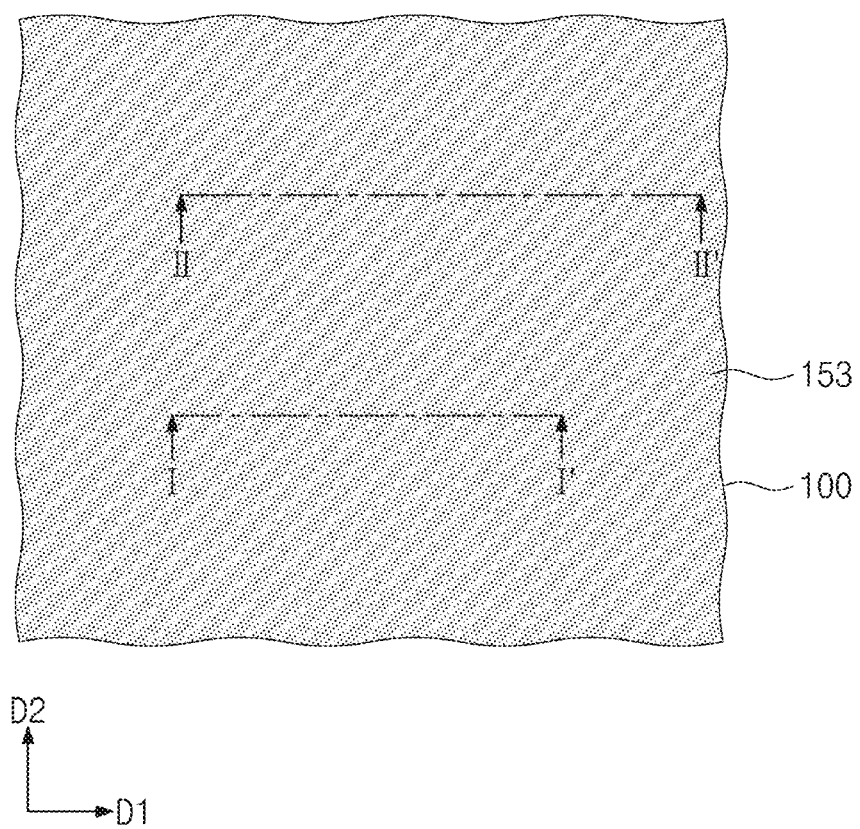
Figure 13B:
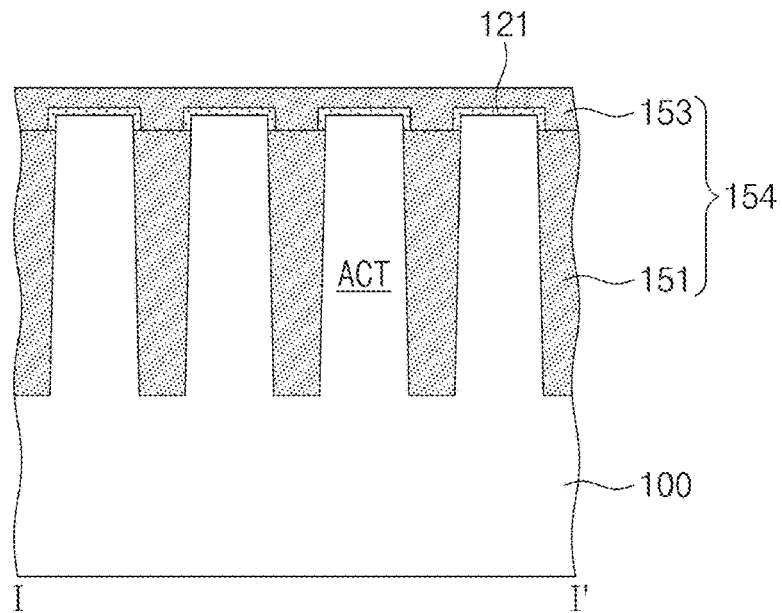
Figure 13C:
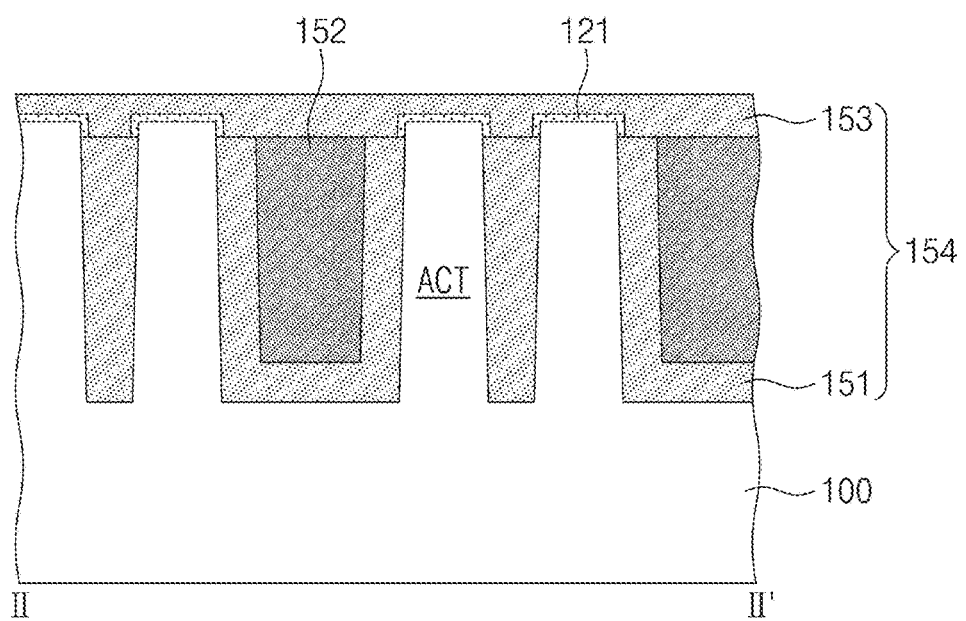

Referring to FIGS. 13A, 13B, and 13C, an upper oxide layer 153 may be formed on the protection pattern 121, the lower oxide layer 151, and the nitride layer 152. The upper oxide layer 153 may be formed to cover the protection pattern 121, the oxide layer 151, and the nitride layer 152. The upper oxide layer 153 may be formed by, for example, at least one of a thermal oxidation process, a chemical vapor deposition process, or an atomic layer deposition process. The upper oxide layer 153 may be formed of, include, or consist of the same material as the lower oxide layer 151. The upper oxide layer 153 may be formed of or include an oxide material. For example, the upper oxide layer 153 may be formed of or include silicon oxide (SiO2). The lower oxide layer 151 and the upper oxide layer 153 may be referred to as an oxide layer 154. The oxide layer 154 and the nitride layer 152 may be referred to, e.g. referred to together, as an insulating pattern.

Figure 14A:
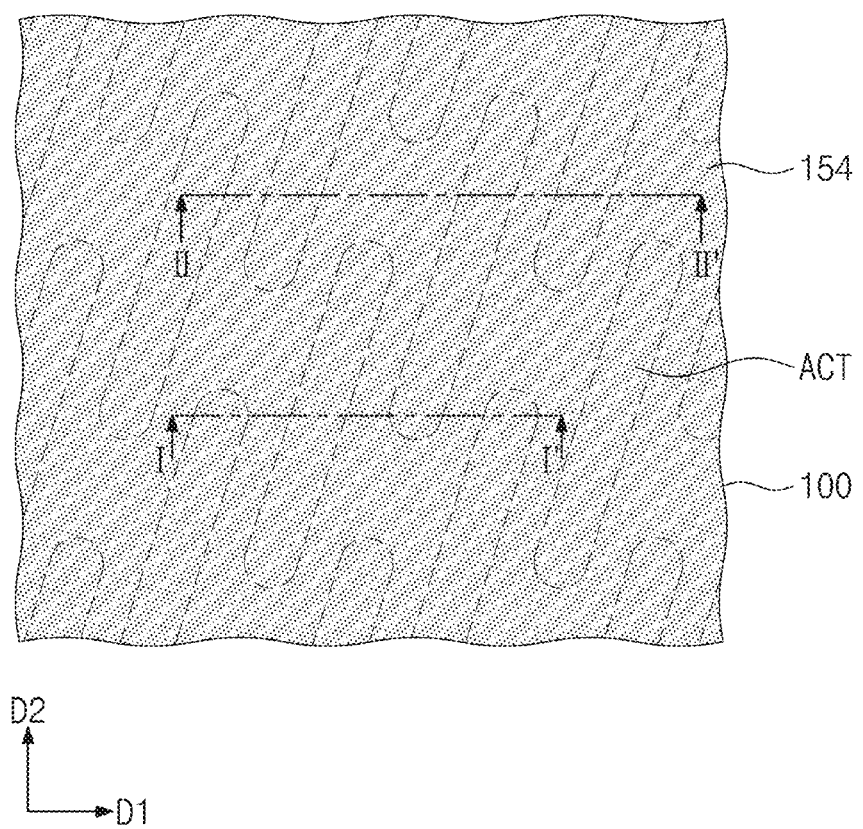
Figure 14B:
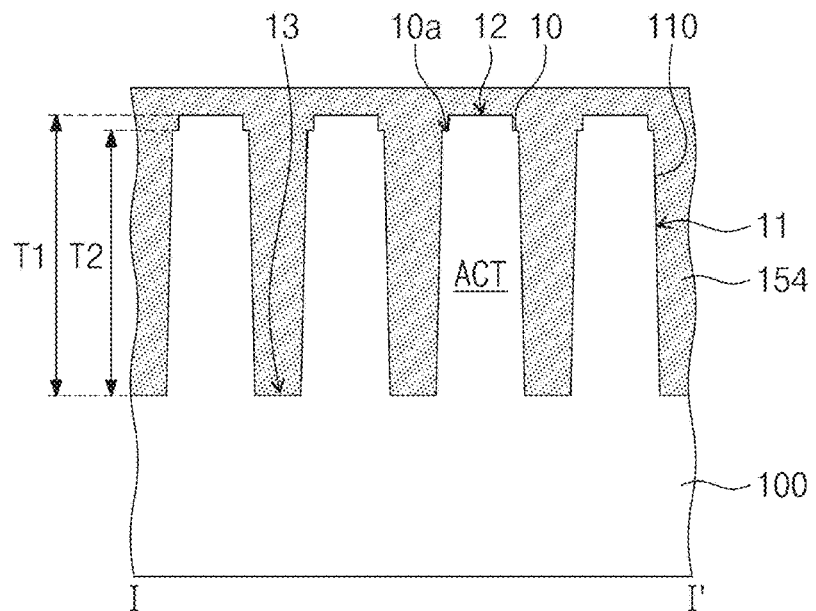
Figure 14C:
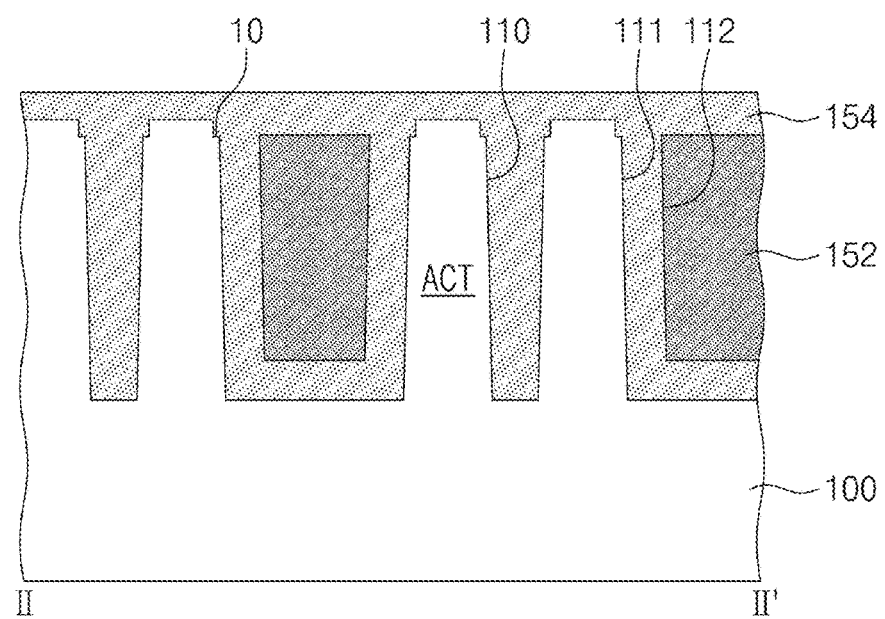

Referring to FIGS. 14A, 14B, and 14C, stepwise portions 10 may be partially formed at opposite topmost ends of the active patterns ACT. The formation of the stepwise portions 10 may include oxidizing the protection pattern 121. As a result of the formation of the oxide layer 154, the protection pattern 121 adjacent to the oxide layer 154 may be oxidized or fully oxidized, e.g. may be fully converted from polysilicon to silicon oxide (SiO2). Hereinafter, the oxide layer 154 may include the protection pattern 121 that is oxidized through this process. Since the protection pattern 121 is oxidized/fully oxidized, the opposite topmost ends of the active patterns ACT adjacent to the oxide layer 154 may also be oxidized. Thus, the stepwise portions 10 may be formed to have a shape, which is recessed or concave toward an inner portion of each active pattern ACT, as compared with the side surface 11 of each active pattern ACT. A distance T1 between the topmost surface 12 of the active patterns ACT and bottom surfaces 13 of the first trenches 110 may be larger than a distance T2 between a bottom step or bottom surface 10a of the stepwise portion 10 and the bottom surfaces 13 of the first trenches 110.

According to some example embodiments of inventive concepts, when a gap-filling process is performed to fill a region between active patterns, the supporting pattern 141 may be used to fix upper portions of the active patterns and to prevent or reduce the likelihood of the active patterns from being bent or fallen. Thus, it may be possible to reduce failure of the semiconductor device and/or to improve reliability of the semiconductor device.

FIGS. 15A to 19A are plan views illustrating a portion of a semiconductor device to describe a modified example of a method of fabricating a semiconductor device according to some example embodiments of inventive concepts. FIGS. 15B to 19B are sectional views respectively taken along lines I-I' of FIGS. 15A to 19A. FIGS. 15C to 19C are sectional views respectively taken along lines II-II' of FIGS. 15A to 19A.

In the process of fabricating a semiconductor device according to some example embodiments of inventive concepts, the fabricating process described with reference to FIGS. 1A to 9A and 1B to 9B may be performed in substantially the same manner. For concise description, features different from the fabrication method described with reference to FIGS. 10A to 14A, 10B to 14B, and 10C to 14C will be mainly explained in the following description.

Figure 15A:
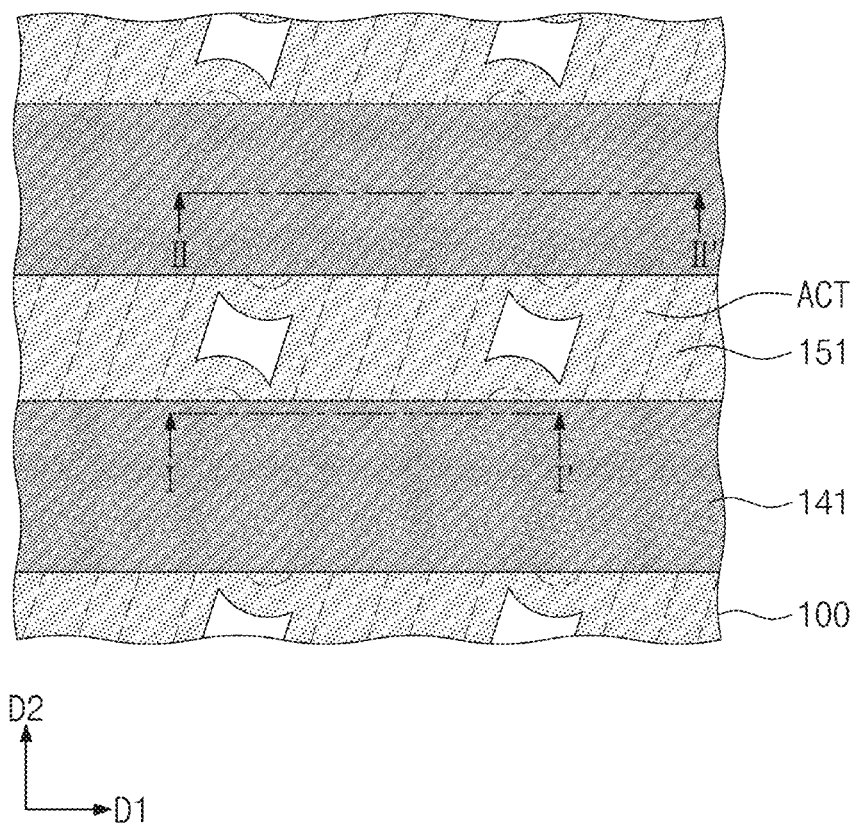
FIGS. 15A, 16A, 17A, 18A, and 19A are plan views illustrating a portion of a semiconductor device to describe a modified example of a method of fabricating a semiconductor device according to some example embodiments of inventive concepts.
Figure 15B:
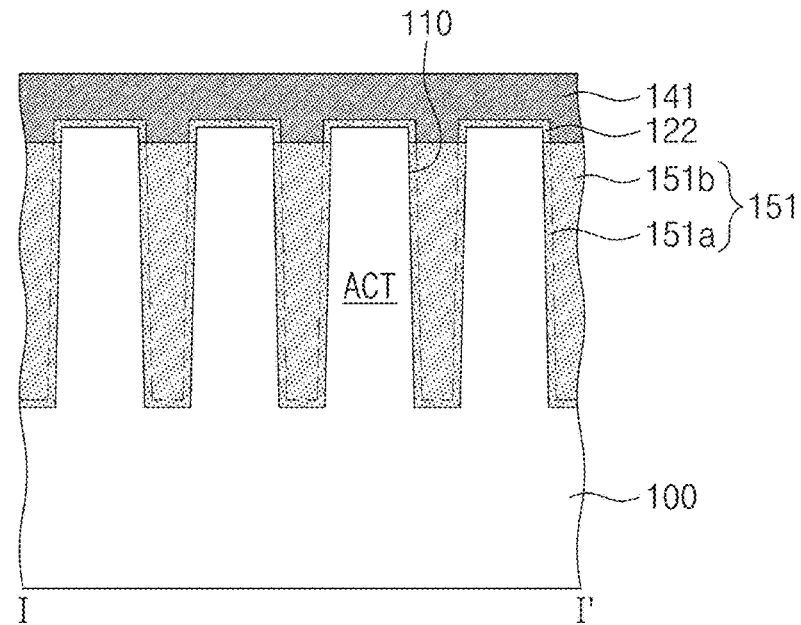
FIGS. 15B, 16B, 17B, 18B, and 19B are sectional views respectively taken along lines I-I' of FIGS. 15A, 16A, 17A, 18A, and 19A.
Figure 15C:
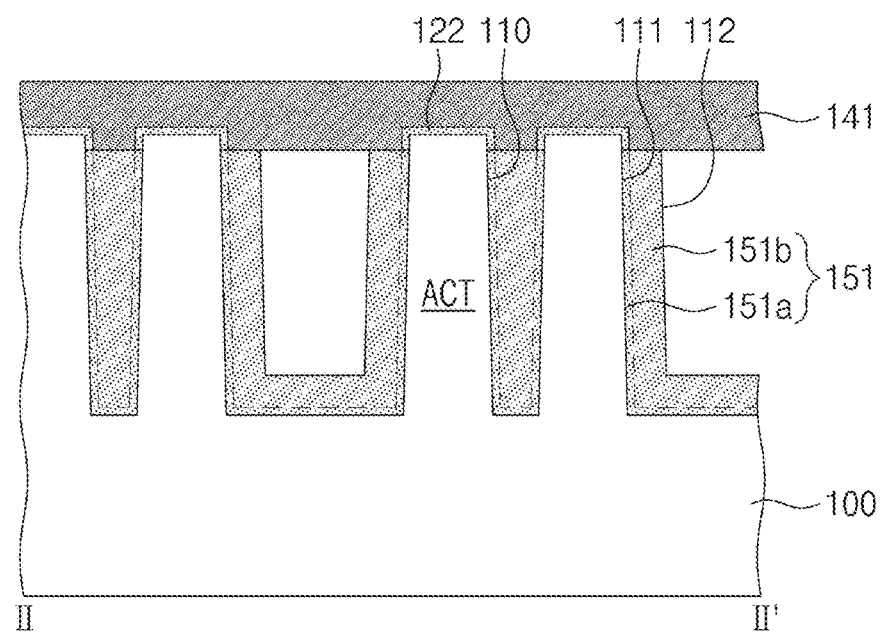
FIGS. 15C, 16C, 17C, 18C, and 19C are sectional views respectively taken along lines II-II' of FIGS. 15A, 16A, 17A, 18A, and 19A.

Referring to FIGS. 15A, 15B, and 15C, the lower oxide layer 151 may be formed in the first and second trenches 110 and 111. The protection layer 120 may be fully oxidized by an oxidation process, which is performed to form the lower oxide layer 151. The protection layer 120 on the bottom and inner side surfaces of the first and second trenches 110 and 111 may be oxidized by the oxidation process, and as a result, a first lower oxide layer 151a may be formed. The supporting pattern 141 may be formed of or include a material susceptible to oxidation, such as polysilicon, and may also be oxidized by the oxidation process. Since the supporting pattern 141 is oxidized, the remaining portion of the protection layer 120 between the supporting pattern 141 and the active patterns ACT may be oxidized to form an oxide pattern, which will be referred to as a protection oxide pattern 122. The oxidation process may be or include a thermal oxidation process such as an ISSG process and/or an LPCVD process, and/or an oxidation treatment process, in which plasma is used. The supporting pattern 141 may be formed of or include a silicon-containing material. For example, the supporting pattern 141 may be formed of or include doped or undoped polysilicon. Thus, the supporting pattern 141 may be amenable to oxidation. The protection oxide pattern 122 may be formed of or include an oxide material. For example, the protection oxide pattern 122 may be formed of or include silicon oxide (SiO2).

The formation of the lower oxide layer 151 may further include forming a second lower oxide layer 151b to fill the remaining portions of the first trenches 110 and portions of the second trenches 111. The first lower oxide layer 151a and the second lower oxide layer 151b may be formed of, include, or consist of the same material. The first lower oxide layer 151a and the second lower oxide layer 151b may be referred, e.g. collectively referred to, as the lower oxide layer 151. The lower oxide layer 151 may be formed to partially fill the second trenches 111 whose width in the first direction D1 is larger than that of the first trenches 110. The lower oxide layer 151 may be formed to conformally cover the bottom and inner side surfaces of the second trenches 111. Since the lower oxide layer 151 is formed to partially fill the second trenches 111, third trenches 112 may be respectively formed in the second trenches 111. Each of the third trenches 112 may be or correspond to an empty region that is formed in a corresponding one of the second trenches 111. The lower oxide layer 151 may be formed of, include, or consist of the same material as the protection oxide pattern 122.

Figure 16A:
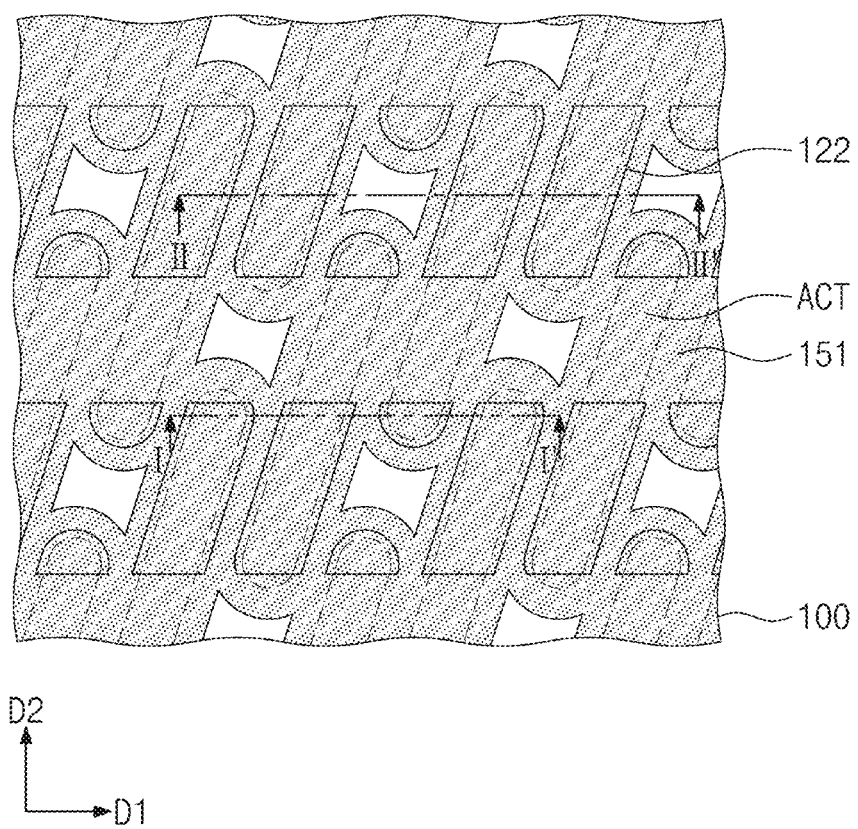
Figure 16B:
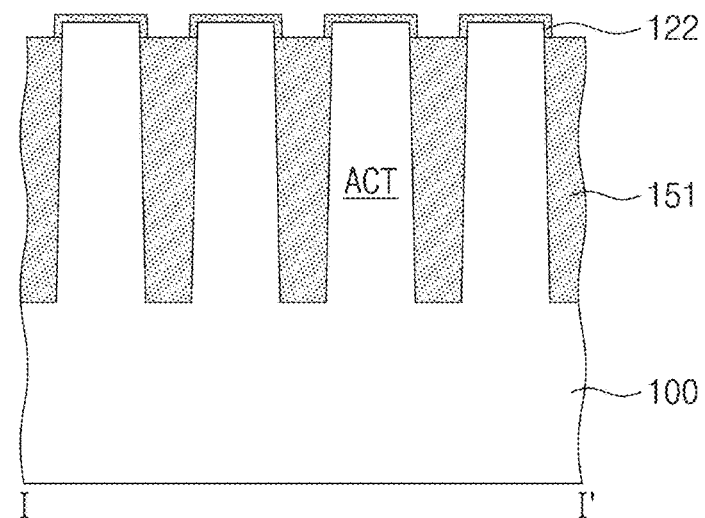
Figure 16C:
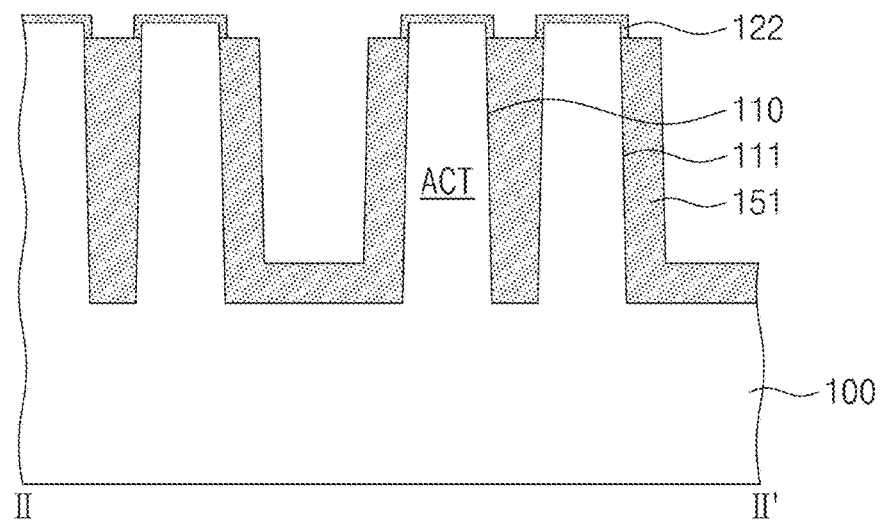

Referring to FIGS. 16A, 16B, and 16C, the supporting pattern 141 may be removed. As a result of the removal of the supporting pattern 141, the protection oxide pattern 122 may be exposed.

Figure 17A:
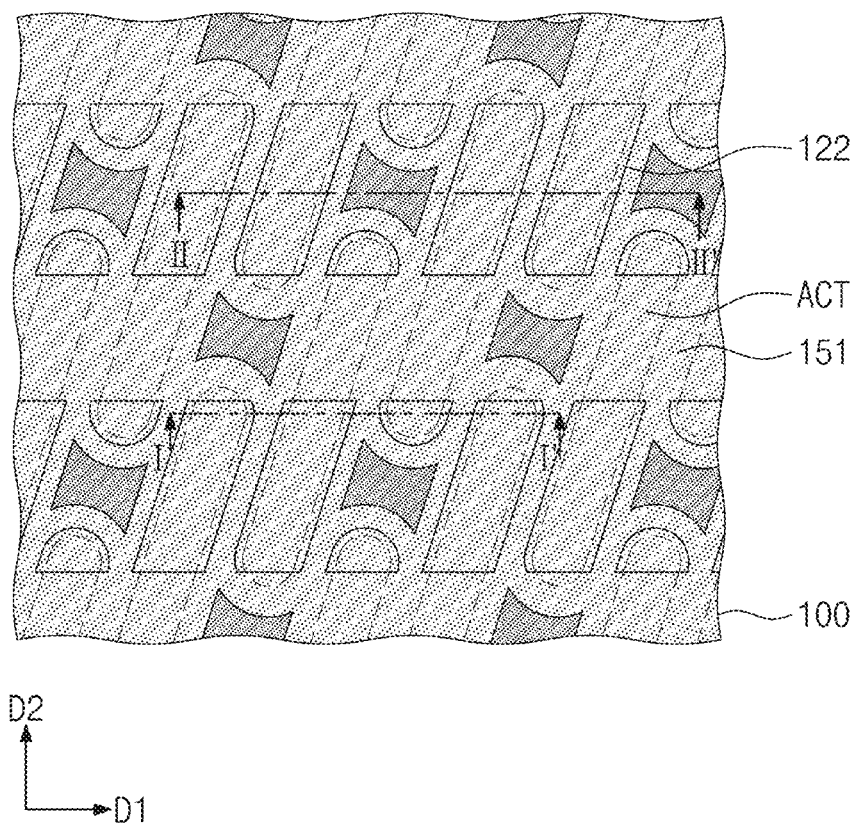
Figure 17B:
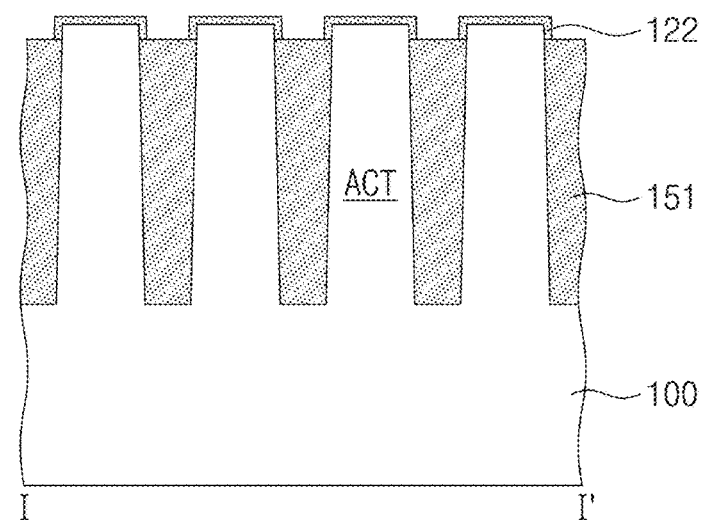
Figure 17C:
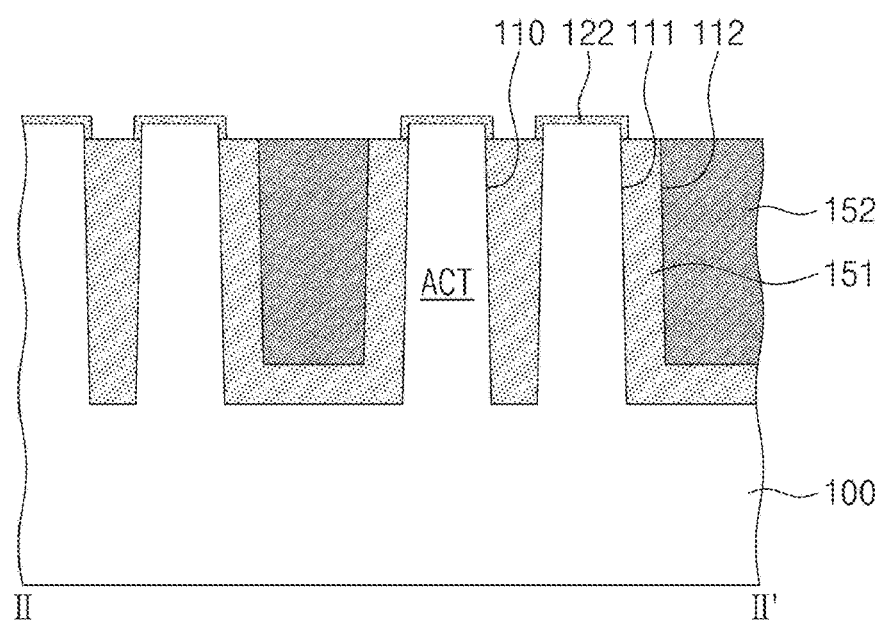

Referring to FIGS. 17A, 17B, and 17C, a nitride layer 152 may be formed to fill a remaining portion of the second trenches 111. The nitride layer 152 may be formed to fully fill the third trenches 112. The nitride layer 152 may initially overfill the third trenches 112 and may be recessed to fully fill the third trenches 112 without overflowing; however, example embodiments are not limited thereto. The lower oxide layer 151 may be interposed between the inner side surfaces of the second trenches 111 and the side surface of the nitride layer 152 and between the bottom surfaces of the second trenches 111 and the bottom surface of the nitride layer 152.

Figure 18A:
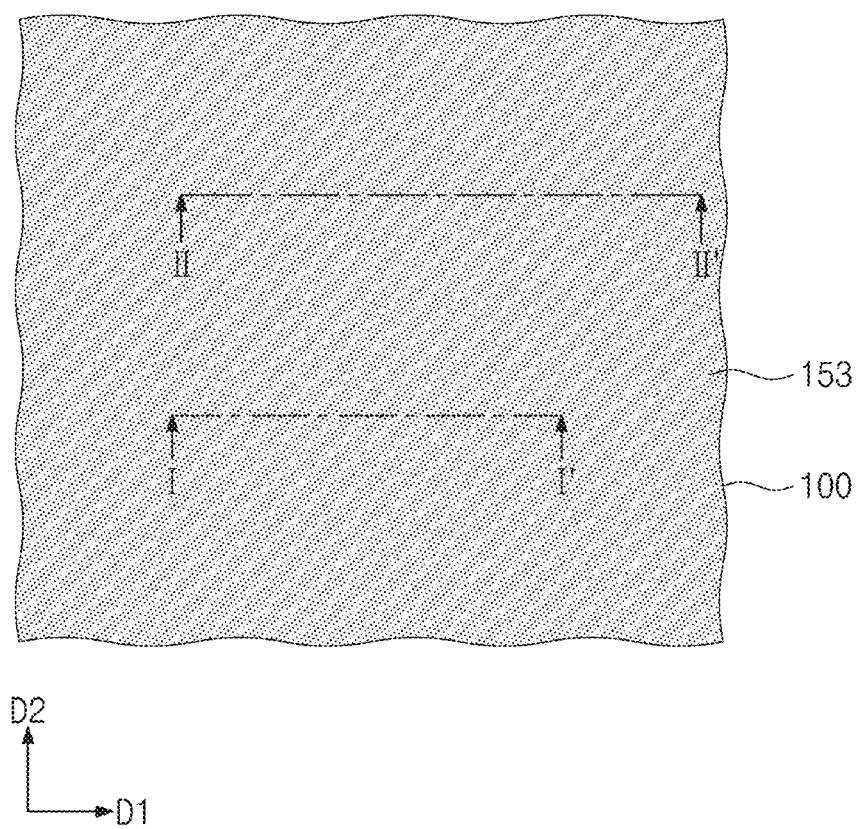
Figure 18B:
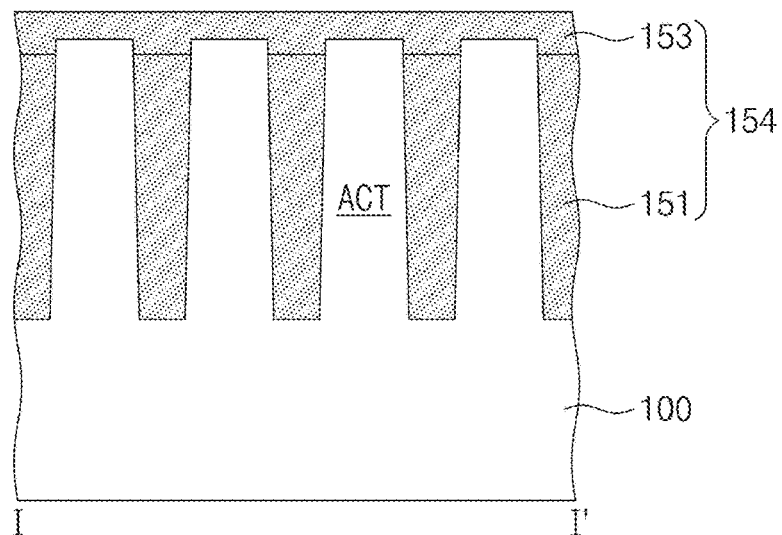
Figure 18C:
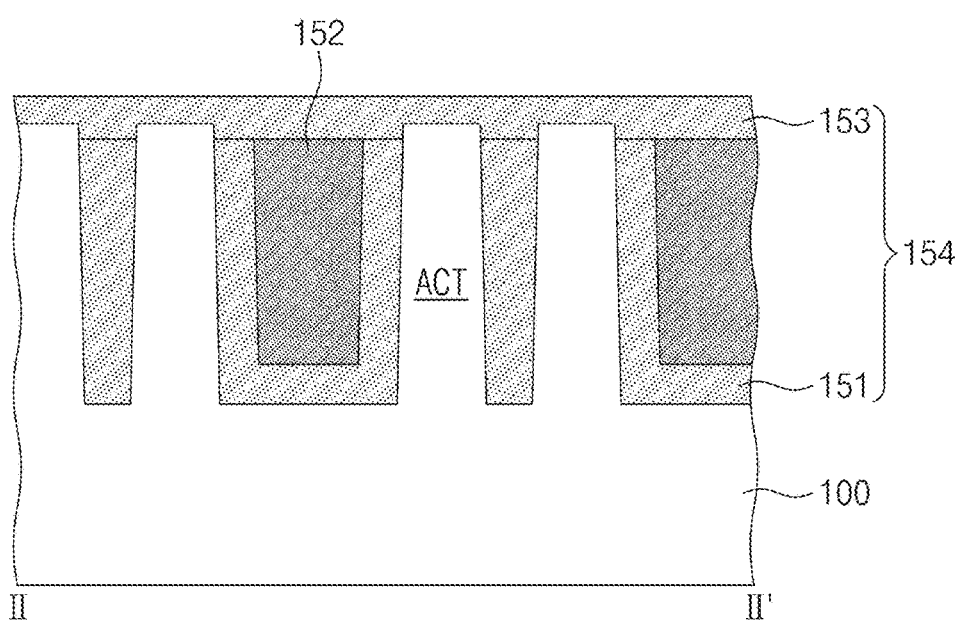

Referring to FIGS. 18A, 18B, and 18C, an upper oxide layer 153 may be formed on the protection oxide pattern 122, the lower oxide layer 151, and the nitride layer 152. The upper oxide layer 153 may be formed to cover the protection oxide pattern 122, the oxide layer 151, and the nitride layer 152. The upper oxide layer 153 may be formed of, include, or consist of the same material as the protection oxide pattern 122. The protection oxide pattern 122, the lower oxide layer 151, and the upper oxide layer 153 may be collectively referred to as an oxide layer 154.

Figure 19A:
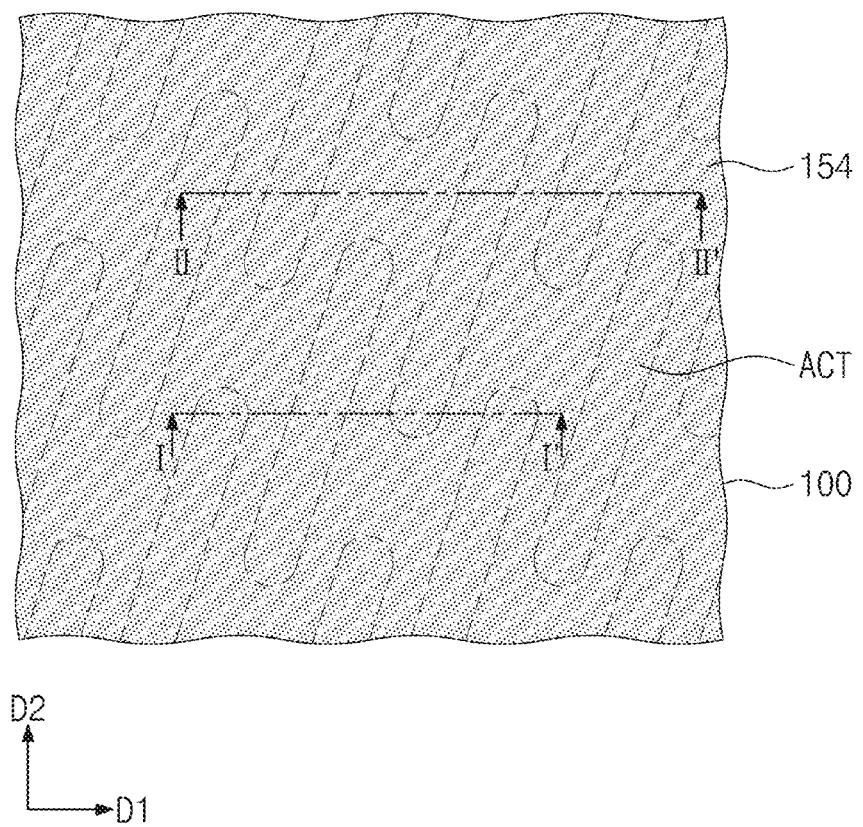
Figure 19B:
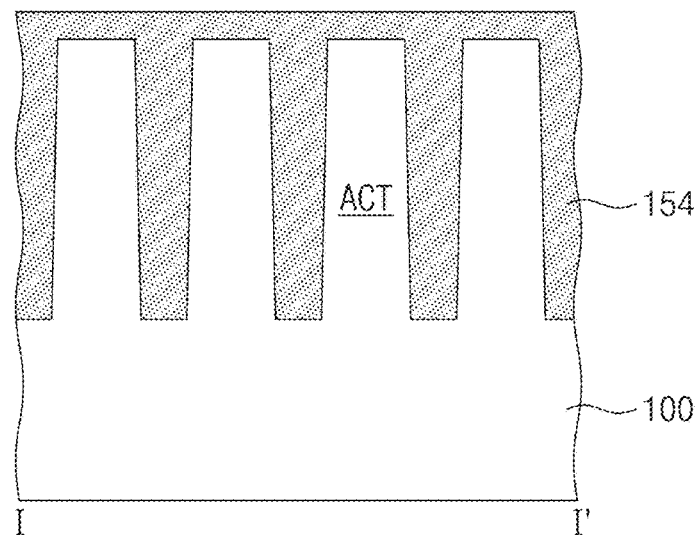
Figure 19C:
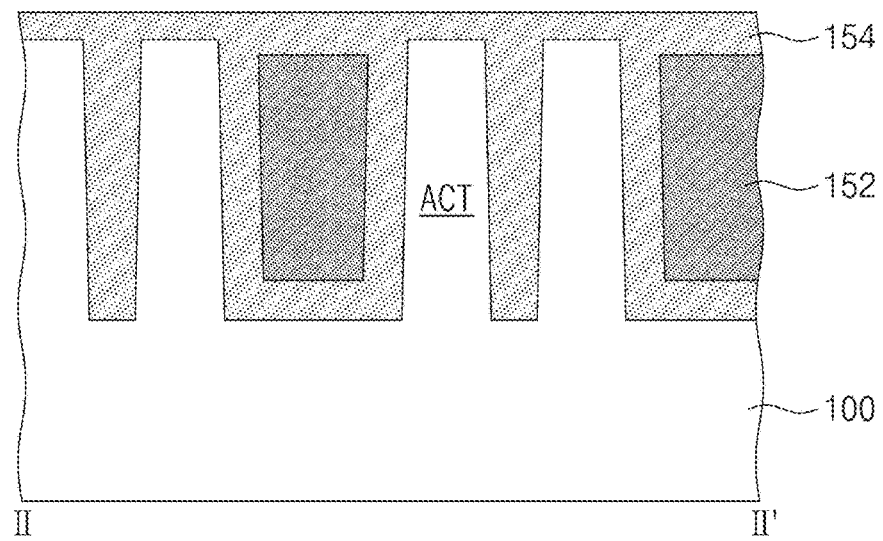

Referring to FIGS. 19A, 19B, and 19C, the oxide layer 154 may be formed to fully cover the active patterns ACT. Unlike the active patterns ACT described with reference to FIGS. 14A, 14B, and 14C, the stepwise portions may not be formed at the opposite topmost ends of the active patterns ACT.

FIGS. 20A to 23A are plan views illustrating a portion of a semiconductor device to describe a modified example of a method of fabricating a semiconductor device according to some example embodiments of inventive concepts. FIGS. 20B to 23B are sectional views respectively taken along lines I-I' of FIGS. 20A to 23A. FIGS. 21C to 23C are sectional views respectively taken along lines II-II' of FIGS. 21A to 23A.

In the process of fabricating a semiconductor device according to the present embodiment of inventive concepts, the fabricating process described with reference to FIGS. 1A to 8A and 1B to 8B may be performed in substantially the same manner. For concise description, features different from the fabrication method described with reference to FIGS. 9A to 14A, 9B to 14B, and 10C to 14C will be mainly explained in the following description.

Figure 20A:
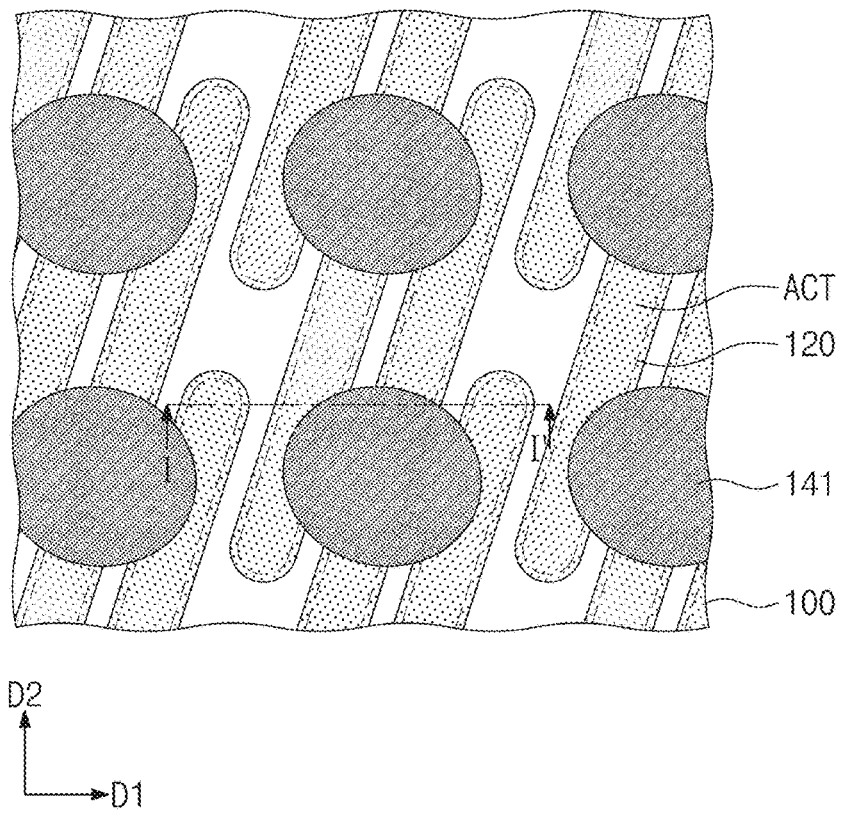
FIGS. 20A, 21A, 22A, and 23A are plan views illustrating a portion of a semiconductor device to describe a modified example of a method of fabricating a semiconductor device according to some example embodiments of inventive concepts.
Figure 20B:
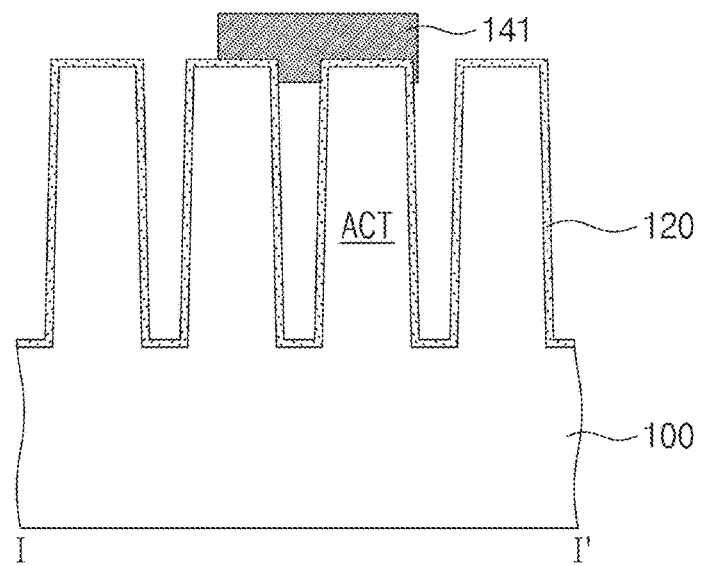
FIGS. 20B, 21B, 22B, and 23B are sectional views respectively taken along lines I-I' of FIGS. 20A, 21A, 22A, and 23A.

Referring to FIGS. 20A and 20B, the supporting pattern 141 may be a plurality of circular and/or oval patterns, when viewed in a plan view. The supporting pattern 141 may be formed to cover the opposite edge portions of the active patterns ACT, when viewed in a plan view.

Figure 21A:
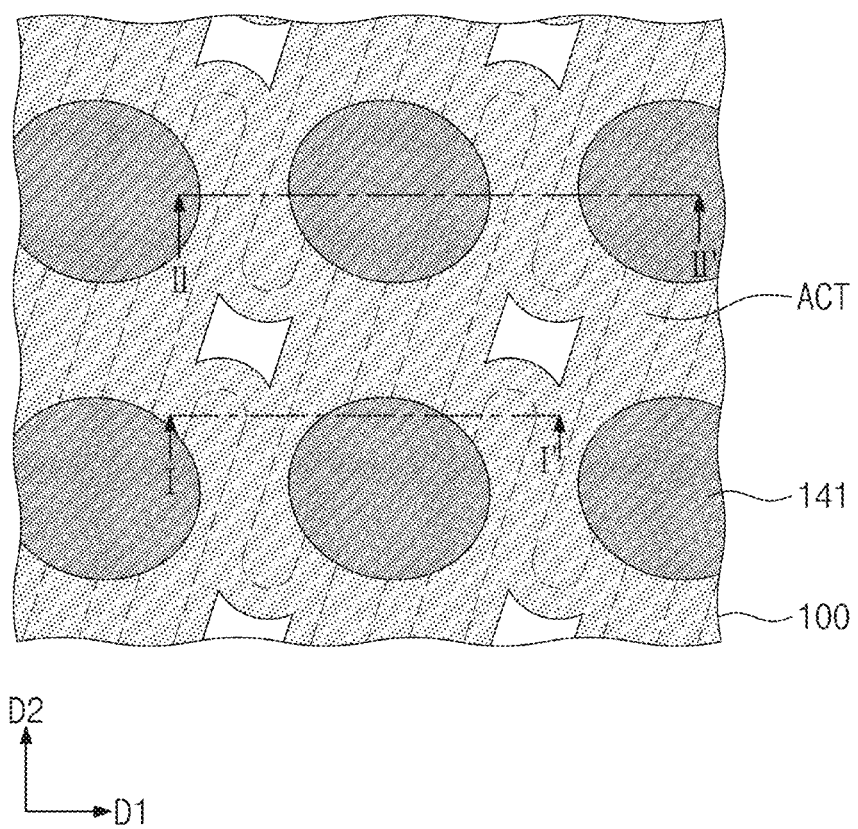
Figure 21B:
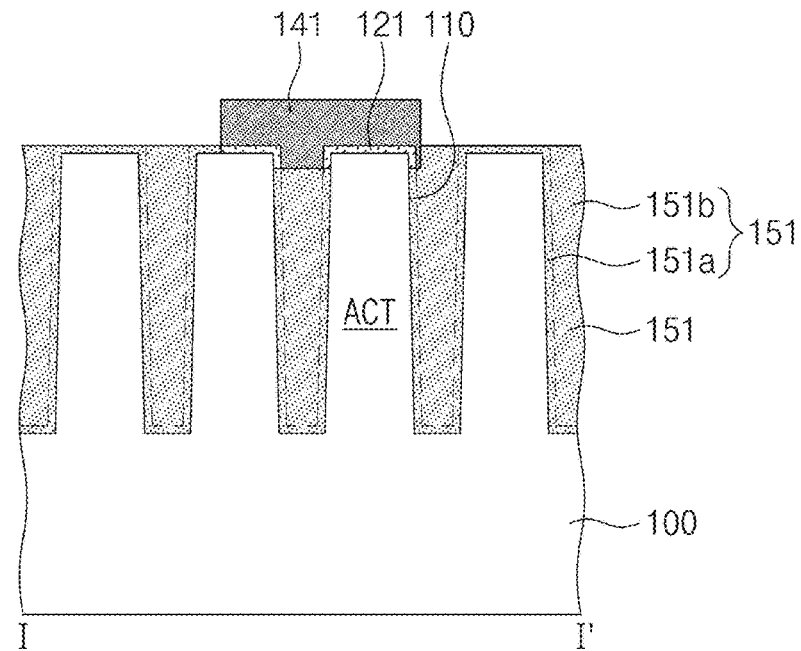
Figure 21C:
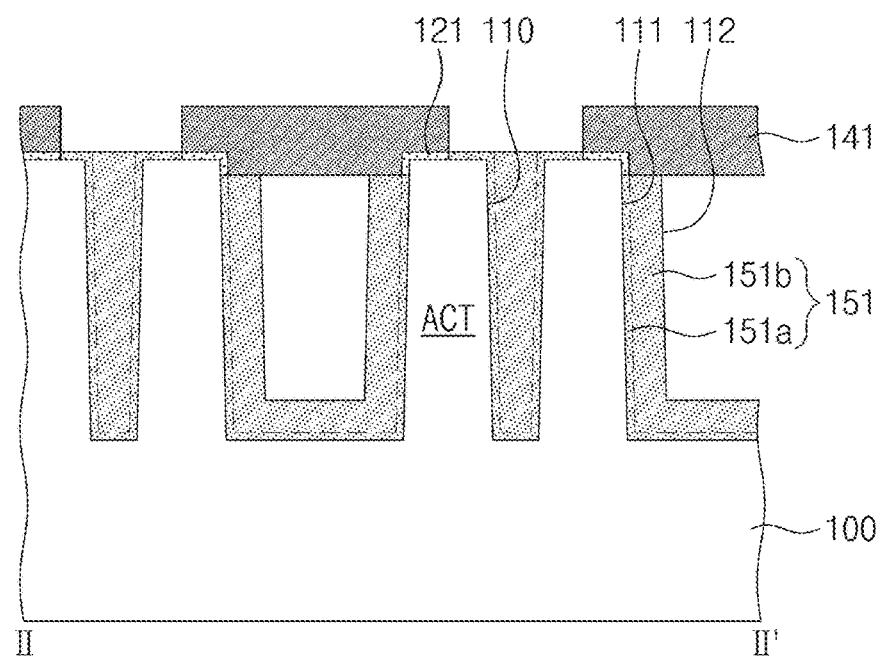
FIGS. 21C, 22C, and 23C are sectional views respectively taken along lines II-II' of FIGS. 21A, 22A, and 23A.

Referring to FIGS. 21A, 21B, and 21C, the lower oxide layer 151 may be formed in the first and second trenches 110 and 111. The protection layer 120 may be partially oxidized by an oxidation process, which is performed to form the lower oxide layer 151. The protection layer 120 on the bottom and inner side surfaces of the first and second trenches 110 and 111 may be oxidized by the oxidation process, and as a result, the first lower oxide layer 151a may be formed. An unoxidized portion of the protection layer 120, which will be referred to as a protection pattern 121, may be left between the supporting pattern 141 and the active patterns ACT. The oxidation process may be or include a thermal oxidation process such as an ISSG process and/or an LPCVD process, and/or an oxidation treatment process in which plasma is used. The supporting pattern 141 may not be oxidized by the oxidation treatment process. The protection pattern 121 covered with the supporting pattern 141 may not be also oxidized.

The formation of the lower oxide layer 151 may further include forming the second lower oxide layer 151b to fill the remaining portions of the first trenches 110 and portions of the second trenches 111. The lower oxide layer 151 may be formed to cover the exposed top surfaces of the active patterns ACT. A top surface of the lower oxide layer 151 on the exposed top surfaces of the active patterns ACT may be located at a level that is lower than a top surface of the supporting pattern 141. The lower oxide layer 151 may be formed to partially fill the second trenches 111 whose width in the first direction D1 is larger than that of the first trenches 110. The lower oxide layer 151 may be formed to conformally cover the bottom and inner side surfaces of the second trenches 111. Since the lower oxide layer 151 is formed to partially fill the second trenches 111, the third trenches 112 may be respectively formed in the second trenches 111. Each of the third trenches 112 may be or include an empty region that is formed in a corresponding one of the second trenches 111.

Figure 22A:
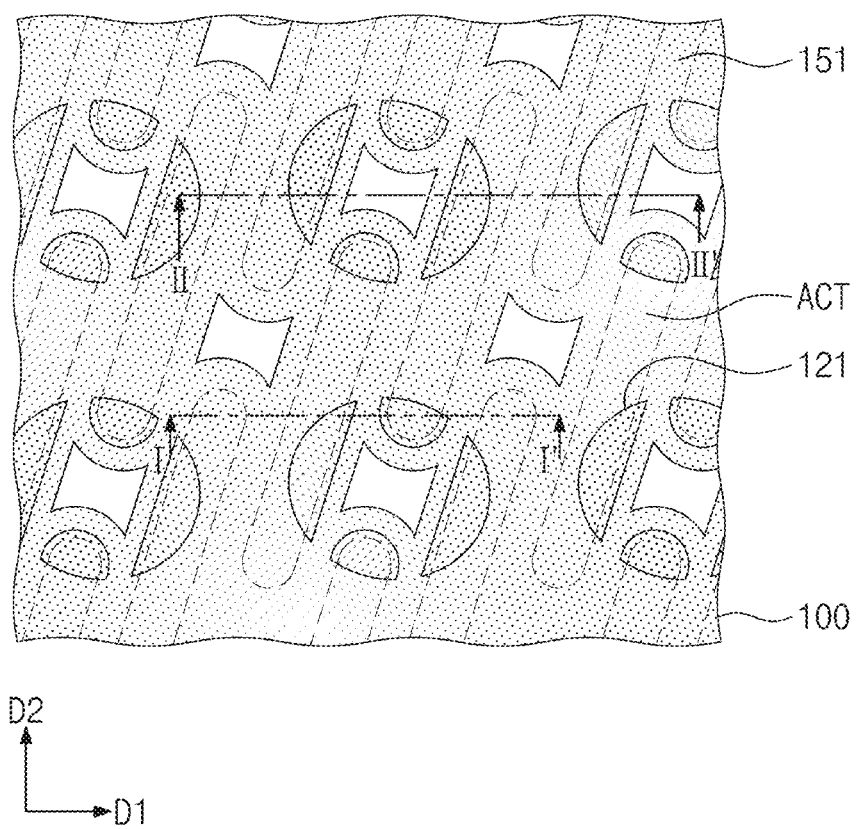
Figure 22B:
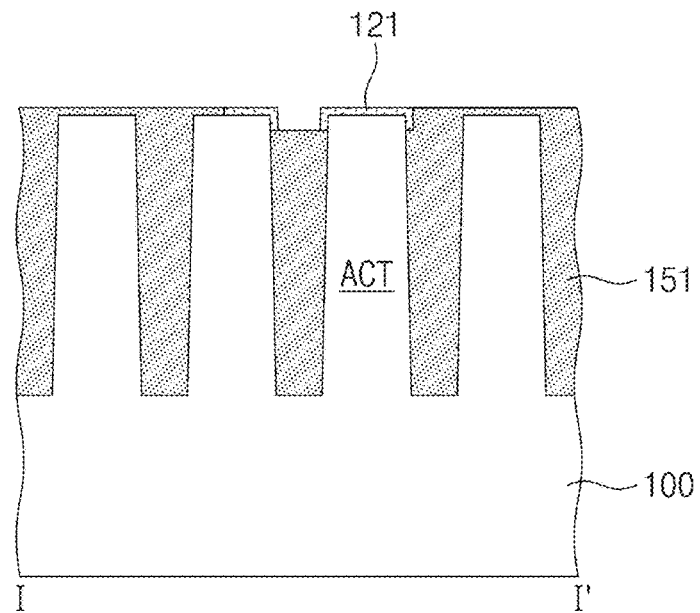
Figure 22C:
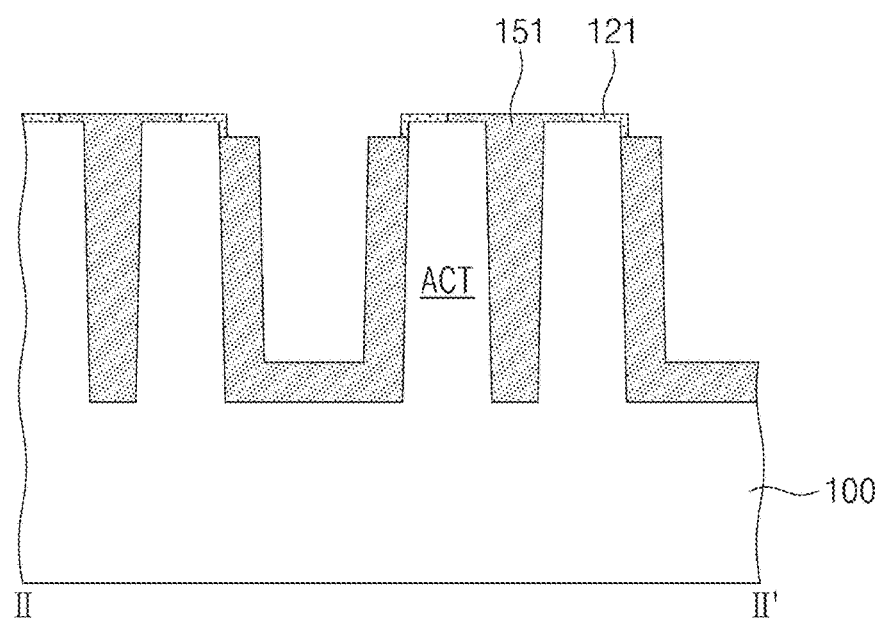

Referring to FIGS. 22A, 22B, and 22C, the supporting pattern 141 may be removed. The removing of the supporting pattern 141 may include performing a wet etching process using an etching solution (e.g., phosphoric acid). The etching solution may selectively etch the supporting pattern 141 and may not, or only minimally, etch the protection pattern 121. As a result of the removal of the supporting pattern 141, the protection pattern 121 may be exposed.

Figure 23A:
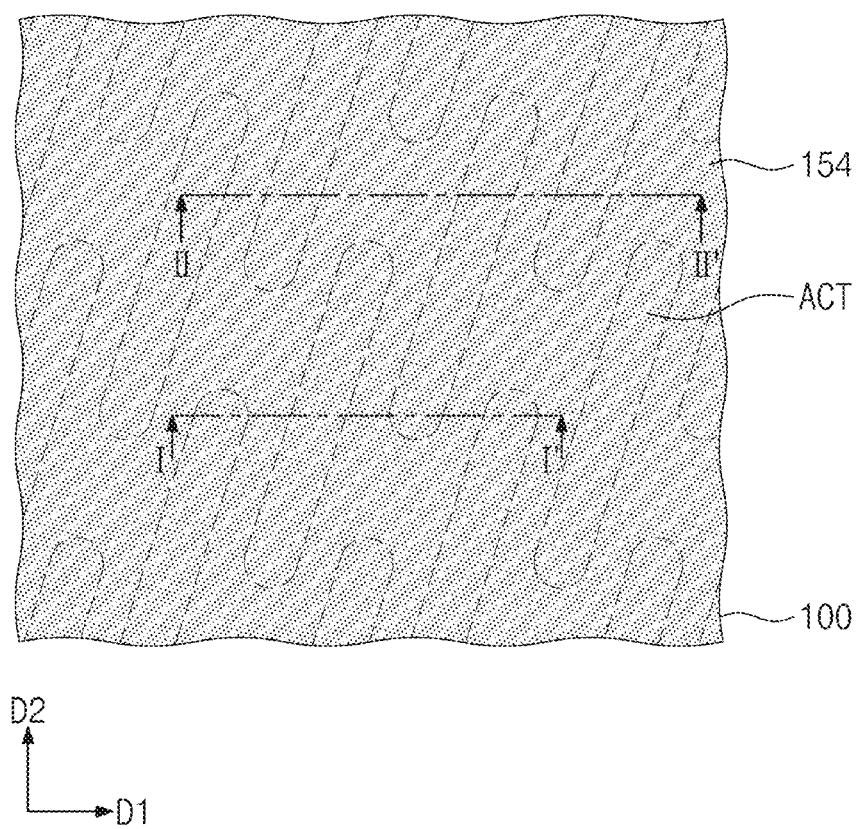
Figure 23B:
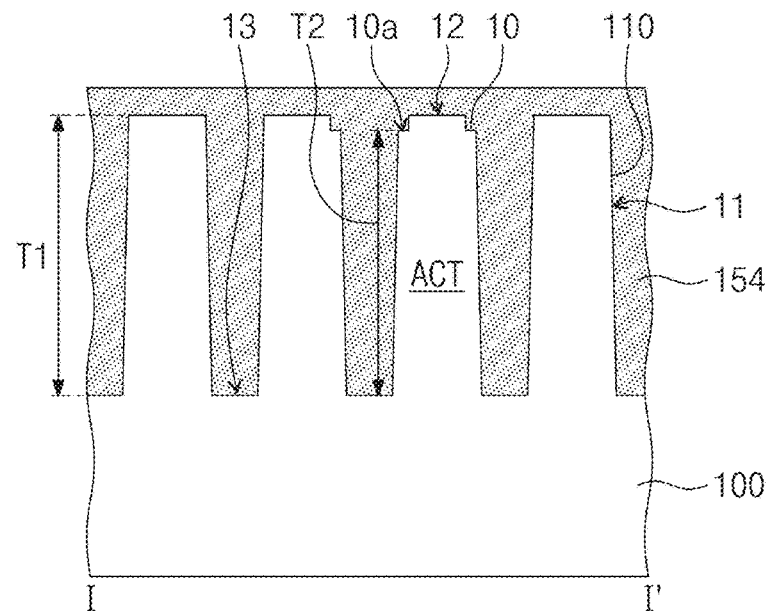
Figure 23C:
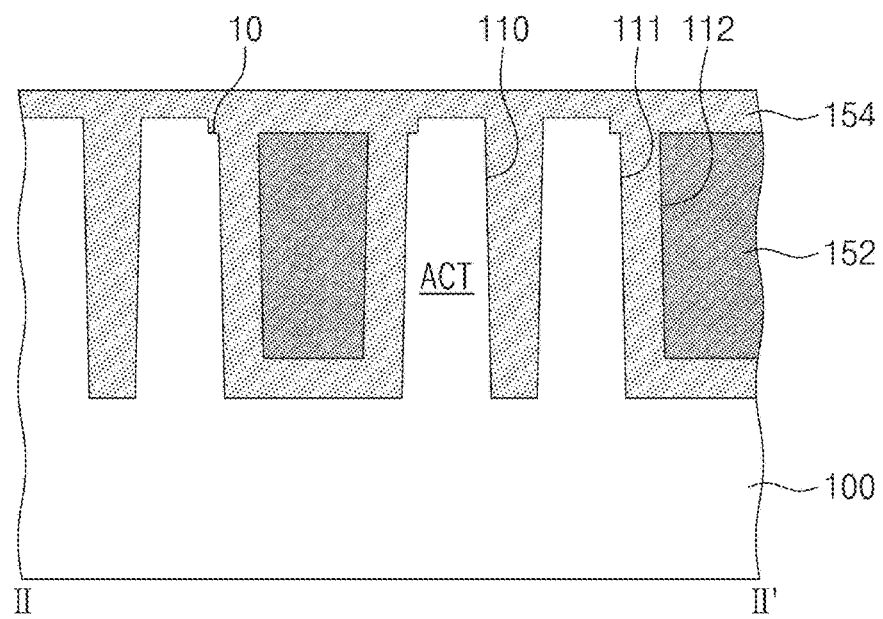

Referring to FIGS. 23A, 23B, and 23C, the nitride layer 152 may be formed to fill a remaining portion of the second trenches 111. The nitride layer 152 may be formed to fully fill the third trenches 112. The lower oxide layer 151 may be interposed between the inner side surfaces of the second trenches 111 and the side surface of the nitride layer 152 and between the bottom surfaces of the second trenches 111 and the bottom surface of the nitride layer 152.

An oxide layer 154 may be formed to cover the protection pattern 121, the lower oxide layer 151, and the nitride layer 152. The oxide layer 154 may be formed to fully cover the first trenches 110. The oxide layer 154 may be interposed between the inner side surfaces of the second trenches 111 and the side surface of the nitride layer 152 and between the bottom surfaces of the second trenches 111 and the bottom surface of the nitride layer 152. The oxide layer 154 may be formed by, for example, at least one of a thermal oxidation process, a chemical vapor deposition process, or an atomic layer deposition process. The oxide layer 154 may be formed of or include an oxide material. For example, the oxide layer 154 may be formed of or include silicon oxide (SiO2).

The stepwise portions 10 may be partially formed at opposite topmost ends of the active patterns ACT. The formation of the stepwise portions 10 may include oxidizing the protection pattern 121. The protection pattern 121 adjacent to the oxide layer 154 may be oxidized as a result of the formation of the oxide layer 154. Hereinafter, the oxide layer 154 may include the protection pattern 121 that is oxidized through this process. Since the protection pattern 121 is oxidized, the opposite topmost ends of the active patterns ACT adjacent to the oxide layer 154 may also be oxidized. Thus, the stepwise portions 10 may be formed to have a shape, which is recessed or concave toward an inner portion of each active pattern ACT, compared with the side surface 11 of each active pattern ACT. A distance T1 between the topmost surface 12 of the active patterns ACT and bottom surfaces 13 of the first trenches 110 may be larger than a distance T2 between a bottom surface 10a of the stepwise portion 10 and the bottom surfaces 13 of the first trenches 110.

FIGS. 24A to 27A are plan views illustrating a portion of a semiconductor device to describe a modified example of a method of fabricating a semiconductor device according to some example embodiments of inventive concepts. FIGS. 24B to 27B are sectional views respectively taken along lines I-I' of FIGS. 24A to 27A. FIGS. 25C to 27C are sectional views respectively taken along lines II-II' of FIGS. 25A to 27A.

In the process of fabricating a semiconductor device according to the present embodiment of inventive concepts, the fabricating process described with reference to FIGS. 1A to 8A and 1B to 8B may be performed in substantially the same manner. For concise description, features different from the fabrication method described with reference to FIGS. 9A to 14A, 9B to 14B, and 10C to 14C will be mainly explained in the following description.

Figure 24A:
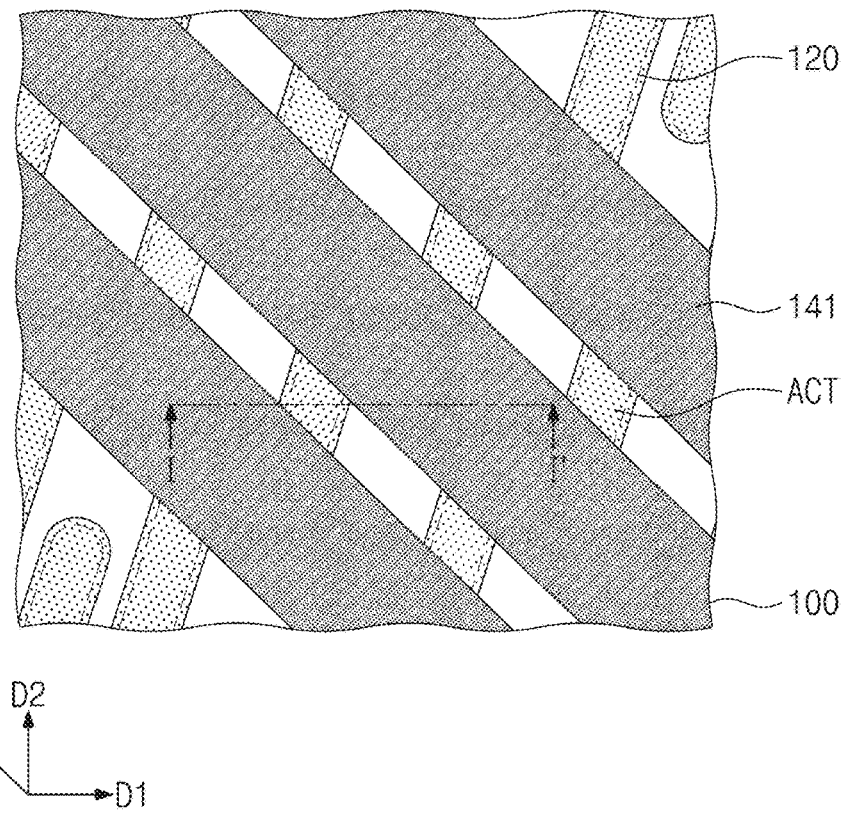
FIGS. 24A, 25A, 26A, and 27A are plan views illustrating a portion of a semiconductor device to describe a modified example of a method of fabricating a semiconductor device according to some example embodiments of inventive concepts.
Figure 24B:
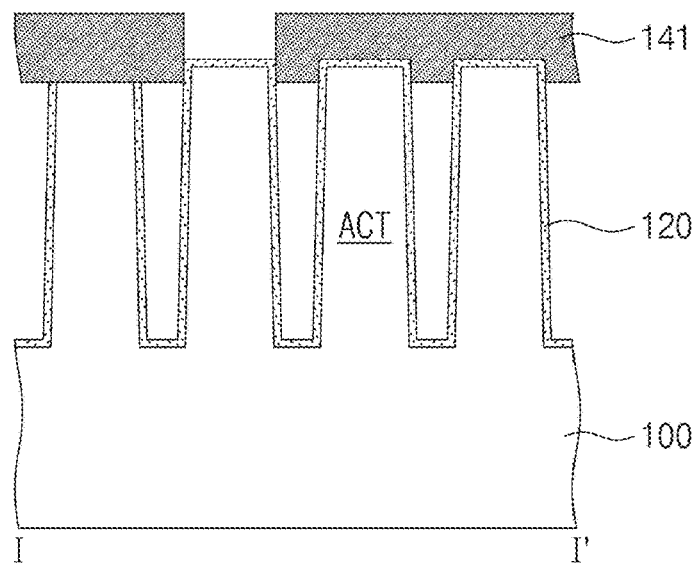
FIGS. 24B, 25B, 26B, and 27B are sectional views respectively taken along lines I-I' of FIGS. 24A, 25A, 26A, and 27A.

Referring to FIGS. 24A and 24B, the supporting pattern 141 may be a plurality of rectangular patterns, when viewed in a plan view. The supporting pattern 141 may be a rectangular pattern elongated in a third direction D3, which is at an obtuse angle to the first direction D1 and is at an acute angle to the second direction D2, when viewed in a plan view. The supporting pattern 141 may be formed to cover the opposite edge portions of the active patterns ACT, when viewed in a plan view.

Figure 25A:
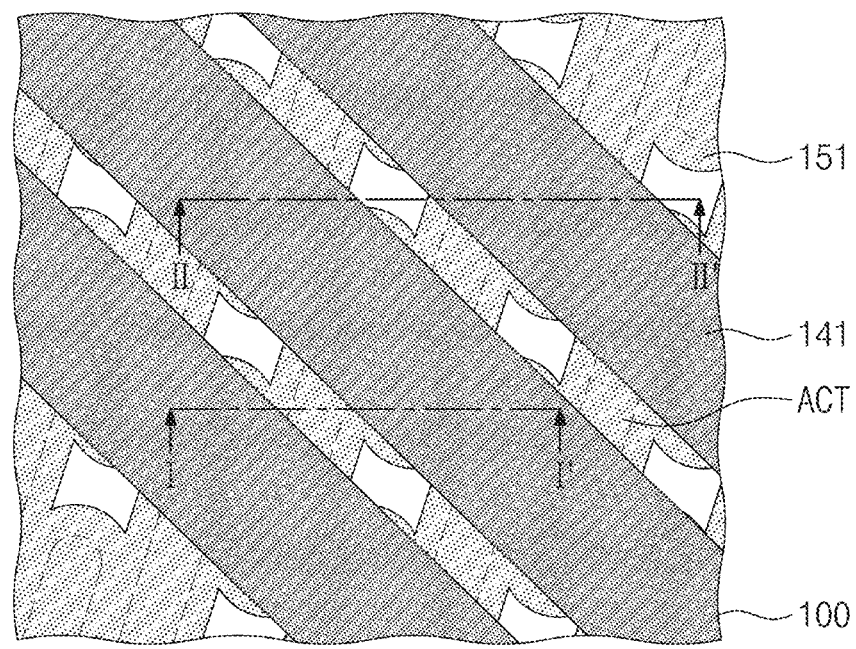
Figure 25B:
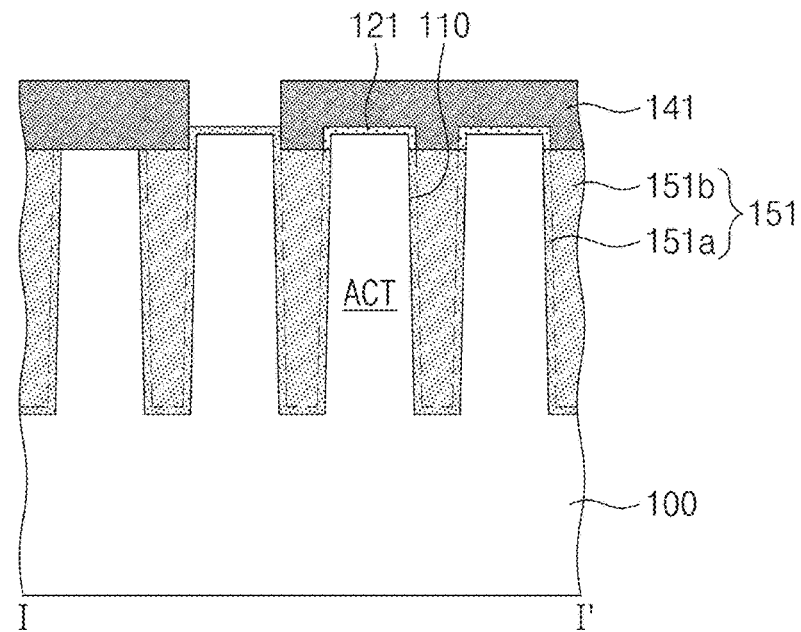
Figure 25C:
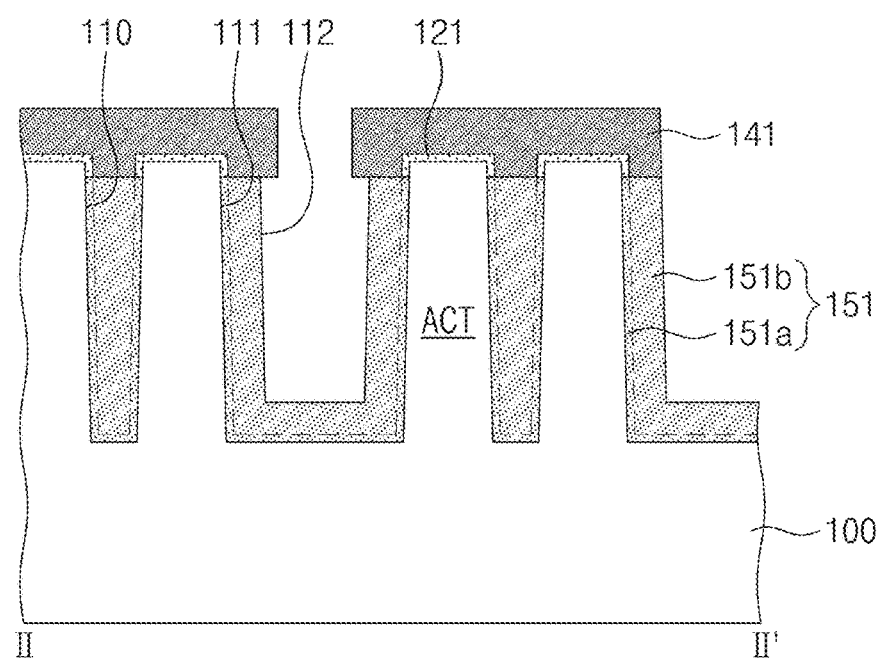
FIGS. 25C, 26C, and 27C are sectional views respectively taken along lines II-II' of FIGS. 25A, 26A, and 27A.

Referring to FIGS. 25A, 25B, and 25C, the lower oxide layer 151 may be formed in the first and second trenches 110 and 111. The protection layer 120 may be partially oxidized by an oxidation process, which is performed to form the lower oxide layer 151. The protection layer 120 on the bottom and inner side surfaces of the first and second trenches 110 and 111 may be oxidized by the oxidation process, and as a result, the first lower oxide layer 151a may be formed. An unoxidized portion of the protection layer 120, which will be referred to as a protection pattern 121, may be left between the supporting pattern 141 and the active patterns ACT. The oxidation process may be or include a thermal oxidation process such as an ISSG process and/or an LPCVD process, and/or an oxidation treatment process, in which plasma is used. The supporting pattern 141 may not be oxidized by the oxidation treatment process. The protection pattern 121 covered with the supporting pattern 141 may not be also oxidized.

The formation of the lower oxide layer 151 may further include forming a second lower oxide layer 151b to fill the remaining portions of the first trenches 110 and portions of the second trenches 111. The lower oxide layer 151 may be formed to cover the exposed top surfaces of the active patterns ACT. The top surface of the lower oxide layer 151 on the exposed top surfaces of the active patterns ACT may be located at a level that is lower than a top surface of the supporting pattern 141. The lower oxide layer 151 may be formed to partially fill the second trenches 111 whose width in the first direction D1 is larger than that of the first trenches 110. The lower oxide layer 151 may be formed to conformally cover the bottom and inner side surfaces of the second trenches 111. Since the lower oxide layer 151 is formed to partially fill the second trenches 111, third trenches 112 may be respectively formed in the second trenches 111. Each of the third trenches 112 may be an empty region that is formed in a corresponding one of the second trenches 111.

Figure 26A:
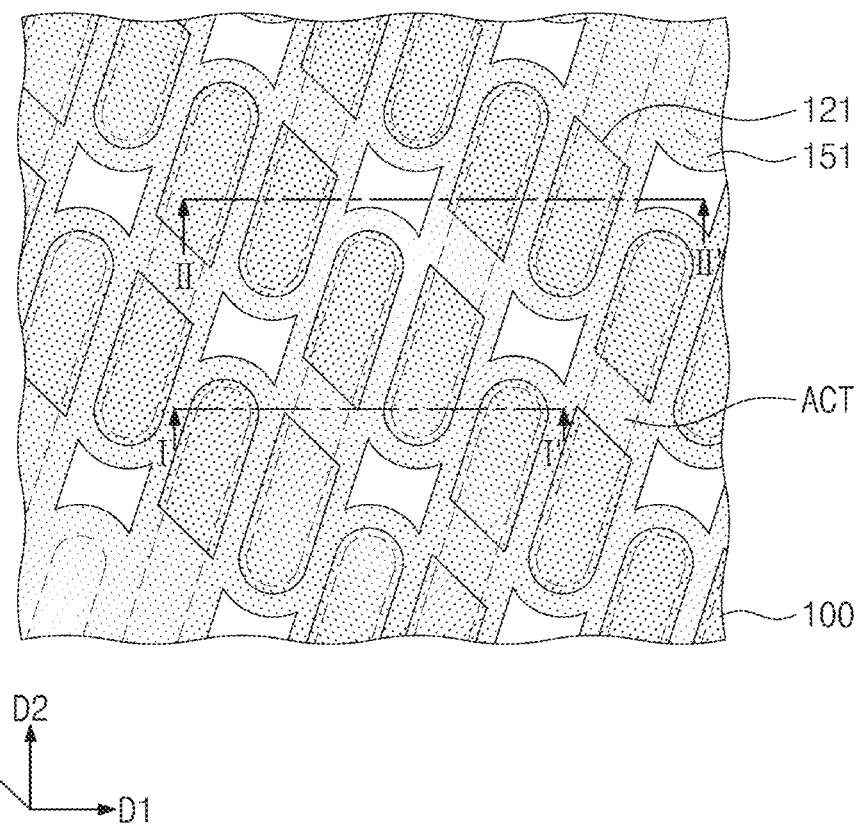
Figure 26B:
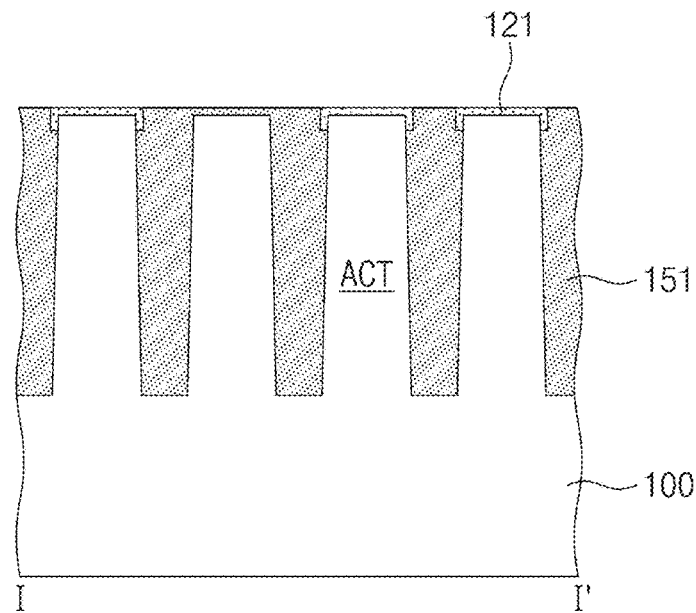
Figure 26C:
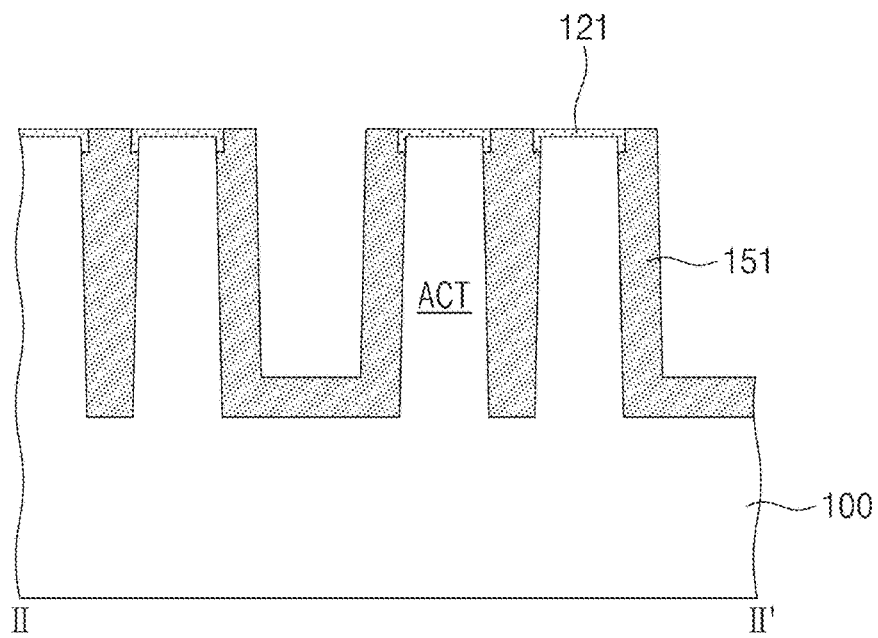

Referring to FIGS. 26A, 26B, and 26C, the supporting pattern 141 may be removed. The removing of the supporting pattern 141 may include performing a wet etching process using an etching solution (e.g., phosphoric acid). As a result of the removal of the supporting pattern 141, the protection pattern 121 may be exposed.

Figure 27A:
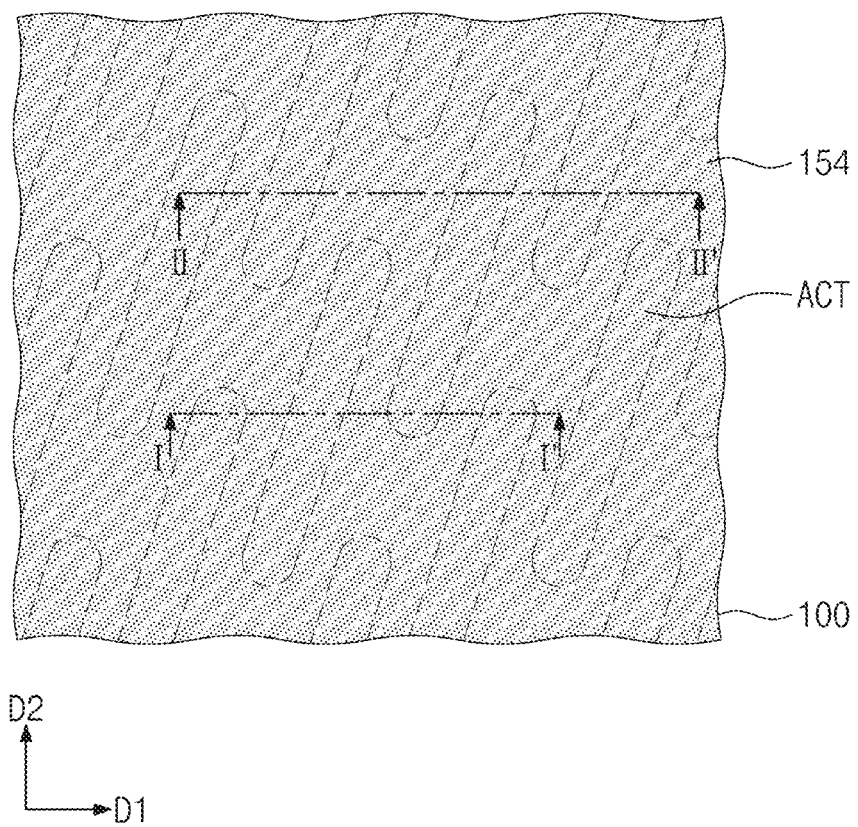
Figure 27B:
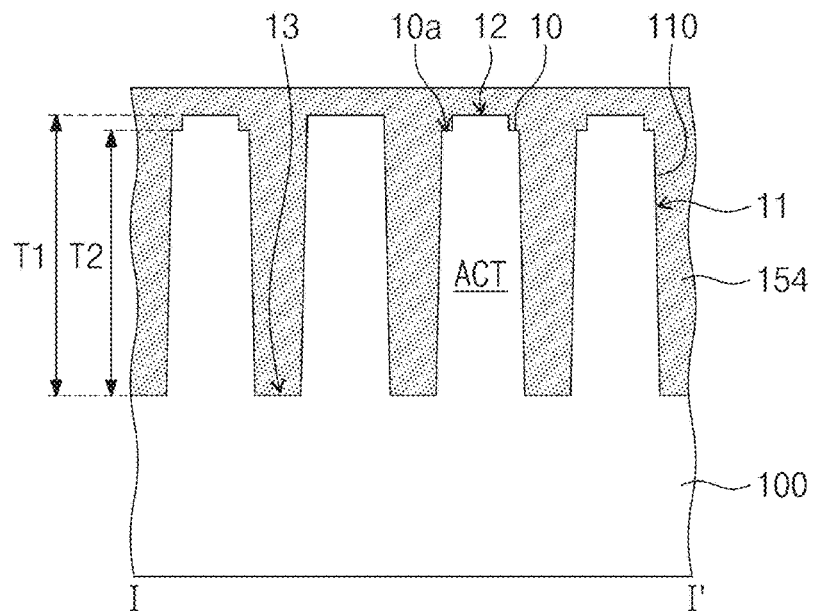
Figure 27C:
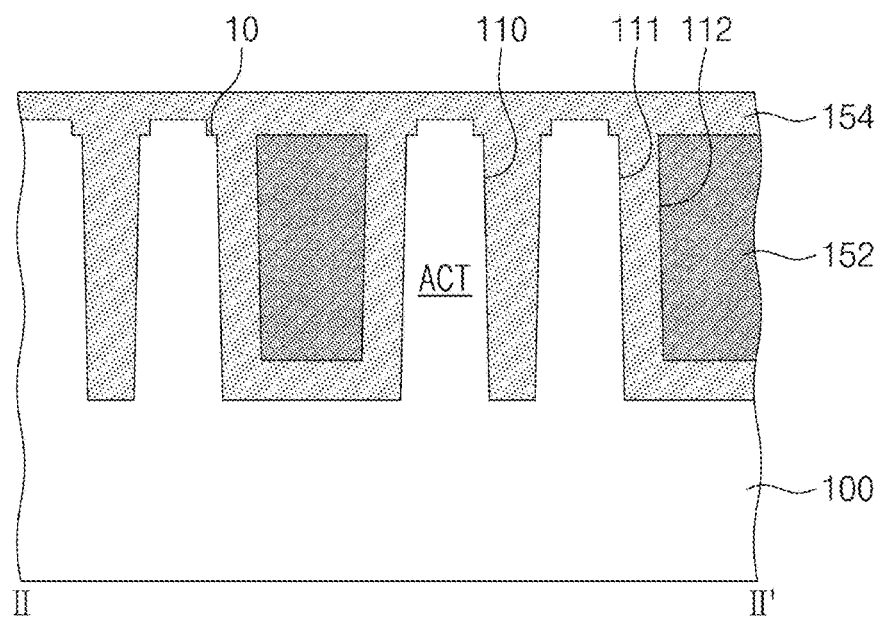

Referring to FIGS. 27A, 27B, and 27C, the nitride layer 152 may be formed to fill a remaining portion of the second trenches 111. The nitride layer 152 may be formed to fully fill the third trenches 112. The lower oxide layer 151 may be interposed between the inner side surfaces of the second trenches 111 and the side surface of the nitride layer 152 and between the bottom surfaces of the second trenches 111 and the bottom surface of the nitride layer 152.

An oxide layer 154 may be formed to cover the protection pattern 121, the lower oxide layer 151, and the nitride layer 152. The oxide layer 154 may be formed to fully cover the first trenches 110. The oxide layer 154 may be interposed between the inner side surfaces of the second trenches 111 and the side surface of the nitride layer 152 and between the bottom surfaces of the second trenches 111 and the bottom surface of the nitride layer 152. The oxide layer 154 may be formed by, for example, a chemical vapor deposition process or an atomic layer deposition process. The oxide layer 154 may be formed of or include an oxide material. For example, the oxide layer 154 may be formed of or include silicon oxide (SiO2).

The stepwise portions 10 may be partially formed at opposite topmost ends of the active patterns ACT. The formation of the stepwise portions 10 may include oxidizing the protection pattern 121. The protection pattern 121 adjacent to the oxide layer 154 may be oxidized as a result of the formation of the oxide layer 154. Hereinafter, the oxide layer 154 may include the protection pattern 121 that is oxidized through this process. Since the protection pattern 121 is oxidized, the opposite topmost ends of the active patterns ACT adjacent to the oxide layer 154 may also be oxidized. Thus, the stepwise portions 10 may be formed to have a shape, which is recessed and/or concave toward an inner portion of each active pattern ACT, compared with the side surface 11 of each active pattern ACT. A distance T1 between the topmost surface 12 of the active patterns ACT and bottom surfaces 13 of the first trenches 110 may be larger than a distance T2 between a bottom surface 10a of the stepwise portion 10 and the bottom surfaces 13 of the first trenches 110.

Figure 28A:
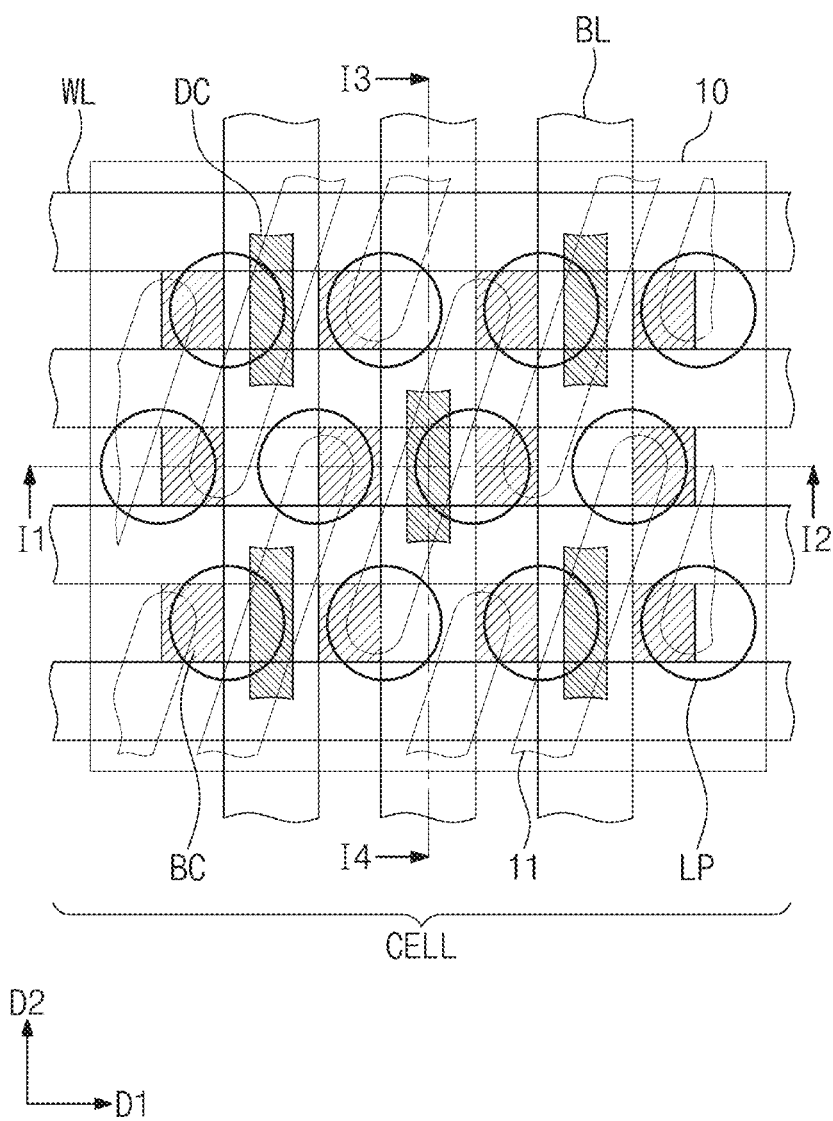
FIG. 28A is a plan view illustrating a semiconductor device, in which a substrate with an active pattern is provided, according to some example embodiments of inventive concepts.
Figure 28B:
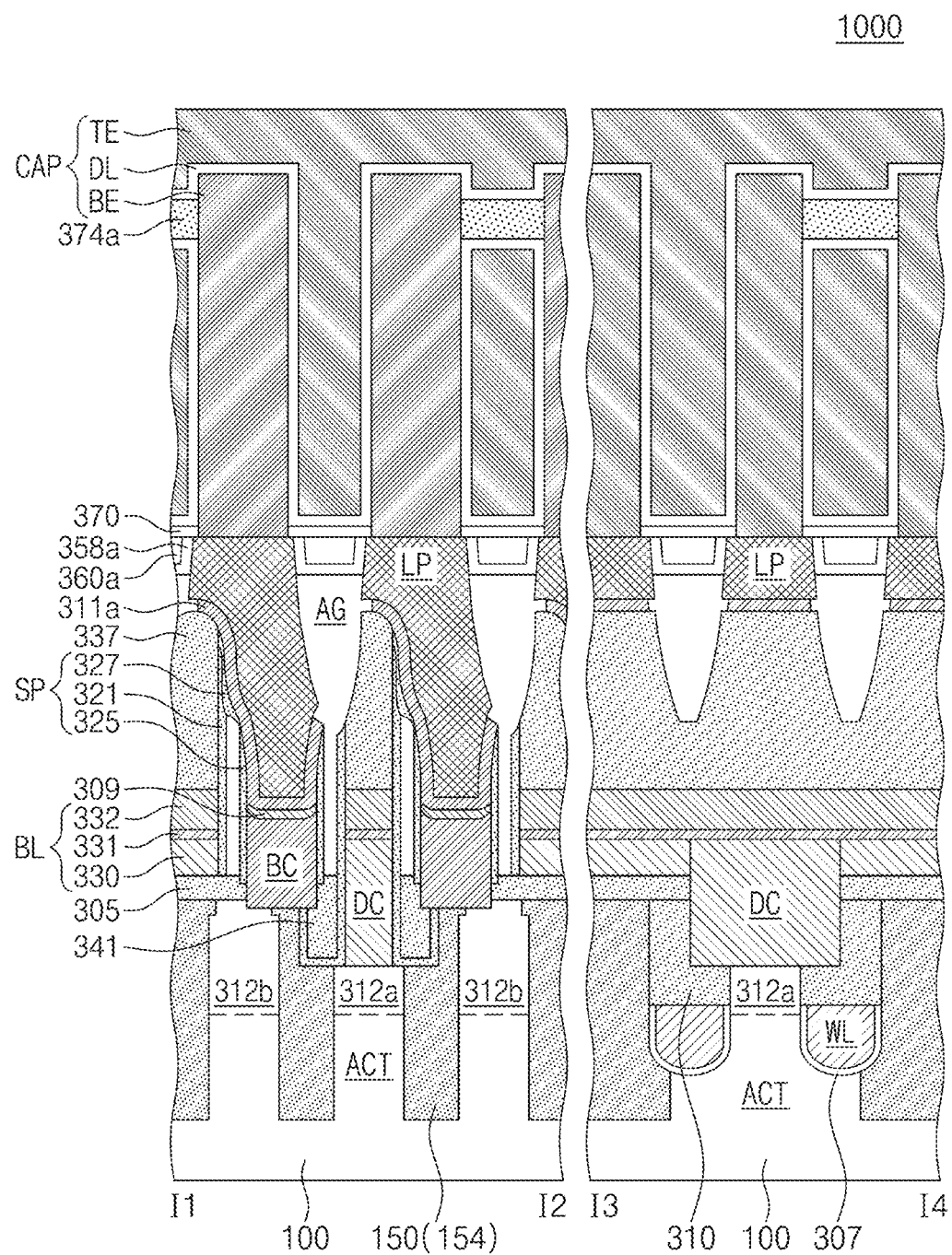
FIG. 28B is a sectional view taken along lines I1-I2 and I3-I4 of FIG. 28A to illustrate a semiconductor device, in which a substrate with an active pattern is provided, according to some example embodiments of inventive concepts.

FIG. 28A is a plan view illustrating a semiconductor device, in which a substrate with an active pattern is provided, according to some example embodiments of inventive concepts. FIG. 28B is a sectional view taken along lines I1-I2 and I3-I4 of FIG. 28A to illustrate a semiconductor device, in which a substrate with an active pattern is provided, according to some example embodiments of inventive concepts. Hereinafter, the oxide layer 154 and the nitride layer 152 may be referred to as an insulating pattern.

Referring to FIGS. 28A and 28B, the insulating pattern may be partially etched to form a device isolation layer 150. The etching of the insulating pattern may be performed to expose the top surfaces of the active patterns ACT. Thus, the device isolation layer 150 may be locally formed in the first and second trenches 110 and 111. The active patterns ACT defined by the device isolation layer 150 may be provided in a cell region CELL of the substrate 100, and word lines WL may be provided on the cell region CELL of the substrate 100. The word lines WL may be spaced apart from each other in the second direction D2 and may be extended in the first direction D1. The word lines WL may be buried in or within the substrate 100. Gate insulating layers 307 may be provided below the word lines WL.

A first doped region 312a may be disposed in the active pattern ACT between a pair of the word lines WL, and a pair of second doped regions 312b may be disposed in opposite edge portions of each active pattern ACT. The first and second doped regions 312a and 312b may be doped with impurities (e.g., of an n type such as phosphorus and/or arsenic). The first doped region 312a may correspond to a common drain region, and the second doped regions 312b may correspond to source regions. The word lines WL and the first and second doped regions 312a and 312b adjacent thereto may constitute or correspond to transistors, e.g. access transistors in DRAM devices.

Word line capping patterns 310 may be disposed on the word lines WL, respectively. The word line capping pattern 310 may be a line-shaped pattern extending in a length direction of the word line WL. An interlayer insulating layer 305 may be disposed on the substrate 100. The interlayer insulating layer 305 may include a plurality of island-shaped patterns, which are spaced apart from each other when viewed in a plan view. The word line capping patterns 310 may be formed of or include nitride such as silicon nitride.

Bit lines BL may be disposed on the interlayer insulating layer 305. The bit lines BL may be disposed to cross the word line capping patterns 310 and the word lines WL. The bit lines BL may be arranged to be spaced apart from each other in the first direction D1 and may be extended in the second direction D2. The bit lines BL may include a bit line polysilicon pattern 330, a bit line ohmic pattern 331, and a bit line metal-containing pattern 332, which are sequentially stacked. Bit line capping patterns 337 may be disposed on the bit lines BL, respectively. The bit line capping patterns 337 may be formed of or include an insulating material (e.g., silicon nitride).

Bit line contacts DC may be provided between adjacent ones of the word lines WL and may be partially buried in the substrate 100. The bit line contact DC may electrically connect the first doped region 312a to the bit line BL. A lower insulating gapfill layer 341 may be disposed on a side surface of the bit line contact DC.

Storage node contacts BC may be disposed between adjacent pairs of the bit lines BL. The storage node contacts BC may be spaced apart from each other. The storage node contacts BC may be formed of or include doped or undoped polysilicon, and/or may be formed of or include metal such as tungsten. A bit line spacer SP may be interposed between the bit line BL and the storage node contact BC. The bit line spacer SP may include a first sub-spacer 321 and a second sub-spacer 325, which are spaced apart from each other by an air gap AG. The first sub-spacer 321 may cover the side surface of the bit line BL and the side surface of the bit line capping pattern 337. The second sub-spacer 325 may be adjacent to the storage node contact BC. The first sub-spacer 321 and the second sub-spacer 325 may be formed of, include, or consist of the same material (e.g., silicon nitride).

A storage node ohmic layer 309 may be disposed on the storage node contact BC. The storage node ohmic layer 309 may be formed of or include at least one of metal silicide materials. The storage node ohmic layer 309, the first and second sub-spacers 321 and 325, and the bit line capping pattern 337 may be conformally covered with a diffusion prevention pattern 311a. The diffusion prevention pattern 311a may be formed of or include at least one of metal nitrides (e.g., titanium nitride or tantalum nitride). A landing pad LP may be disposed on the diffusion prevention pattern 311a. The landing pad LP may be formed of or include a metal-containing material (e.g., tungsten). The landing pad LP may include an upper portion that has a width larger than that of the storage node contact BC. The center of the landing pad LP may be shifted from or with respect to the center of the storage node contact BC. A first capping pattern 358a and a second capping pattern 360a may be provided between adjacent ones of the landing pads LP. Each of the first and second capping patterns 358a and 360a may include at least one of a silicon nitride layer, a silicon oxide layer, a silicon oxynitride layer, or a porous layer. The first capping pattern 358a may have porosity that is higher than the second capping pattern 360a.

The air gap AG between the first and second sub-spacers 321 and 325 may be extended into a region between the landing pads LP. The first capping pattern 358a, the bit line capping pattern 337, and the landing pad LP may be partially exposed by the air gap AG. The air gap AG may include air, such as clean, dry air, and/or may be under vacuum, e.g. may have a pressure less than atmospheric pressure.

Bottom electrodes BE may be disposed on the landing pads LP, respectively. The bottom electrode BE may be formed of or include at least one of doped polysilicon, metal nitrides (e.g., titanium nitride), or metals (e.g., tungsten, aluminum, and/or copper). The bottom electrode BE may have a circular pillar shape, a hollow cylinder shape, and/or a cup shape such as a wine-glass shape. Upper side surfaces of adjacent ones of the bottom electrodes BE may be connected to each other by a supporting pattern 374a. The supporting pattern 374a may be formed of or include at least one of insulating materials (e.g., silicon nitride, silicon oxide, and silicon oxynitride).

Between the bottom electrodes BE, the first and second capping patterns 358a and 360a may be covered with an etch stop layer 370. The etch stop layer 370 may be formed of or include at least one of insulating materials (e.g., silicon nitride, silicon oxide, and/or silicon oxynitride). The surfaces of the bottom electrodes BE and the supporting pattern 374a may be covered with a dielectric layer DL. The dielectric layer DL may be covered with a top electrode TE. The top electrode TE may include at least one of a doped poly-silicon layer, a doped silicon germanium layer, a metal nitride layer (e.g., a titanium nitride layer), or a metal layer (e.g., tungsten, aluminum, and/or copper layers). The bottom electrode BE, the dielectric layer DL, and the top electrode TE may constitute or correspond to a capacitor CAP, e.g. a capacitor CAP used in Dynamic Random Access Memory (DRAM) devices . . . .

In a semiconductor device according to some example embodiments of inventive concepts, a supporting pattern may be used to fix upper portions of active patterns, when a gap-filling process is performed to fill a region between the active patterns, and thus, it may be possible to prevent or reduce the likelihood of the active patterns from being bent or fallen. Thus, it may be possible to reduce failure of the semiconductor device and to improve reliability of the semiconductor device.

While example embodiments of inventive concepts have been particularly shown and described, it will be understood by one of ordinary skill in the art that variations in form and detail may be made therein without departing from the spirit and scope of the attached claims.

What is claimed is:
1. A semiconductor device, comprising:
a substrate having a plurality of trenches;
an insulating pattern fully covering bottom surfaces, top surfaces, and inner sides surfaces of the plurality of trenches; and
active patterns defined by the plurality of trenches,
wherein the active patterns are spaced apart from each other in a first direction and are parallel to each other, the first direction parallel to a top surface of the substrate, and at least one of opposite topmost ends of the active patterns has a stepwise portion, wherein
the stepwise portion comprises of a bottom surface and a side surface, and the bottom surface is parallel to a top surface of the active pattern,
the insulating pattern is in continuous contact with the bottom surfaces, top surfaces, and inner side surfaces of the plurality of trenches and the bottom surface and side surface of the stepwise portion,
the insulating pattern covers a top surface of the active patterns and a top surface of the plurality of trenches, and
the insulating pattern has a planar top surface.

2. The semiconductor device of claim 1, wherein a distance from topmost surfaces of the active patterns to the bottom surfaces of the plurality of trenches is larger than a distance from a bottom step of the stepwise portion to the bottom surfaces of the plurality of trenches.

3. The semiconductor device of claim 1, wherein the stepwise portion has a shape which is recessed or is concave toward an inner portion of each active pattern compared with a side surface of each active pattern.

4. The semiconductor device of claim 3 wherein the shape of the stepwise portion is concave toward the inner portion of each active pattern compared with the side surface of each active pattern.

5. The semiconductor device of claim 3 wherein the shape of the stepwise portion is recessed toward the inner portion of each active pattern compared with the side surface of each active pattern.

6. The semiconductor device of claim 1, wherein
the plurality of trenches comprise first trenches and second trenches, and
a width of bottom surfaces of the second trenches in the first direction is greater than a width of bottom surfaces of the first trenches in the first direction.

7. The semiconductor device of claim 6, wherein
the insulating pattern comprises a lower oxide layer and a nitride layer,
the lower oxide layer fills the first trenches, and
the lower oxide layer conformally covers bottom surfaces of the second trenches and inner side surfaces of the second trenches.

8. The semiconductor device of claim 7, wherein the nitride layer fills remaining portions of the second trenches.

9. The semiconductor device of claim 8, wherein
the insulating pattern further comprises an upper oxide layer, and
the upper oxide layer covers top surfaces of the lower oxide layer, covers the nitride layer, and covers the active patterns.

10. The semiconductor device of claim 9, wherein
the upper oxide layer comprises a same material as the lower oxide layer, and
the nitride layer comprises a material different from the lower oxide layer and different from the upper oxide layer.

11. A semiconductor device, comprising:
a substrate having a plurality of trenches, the plurality of trenches including first trenches and second trenches having widths different from each other;
active patterns defined by the plurality of trenches;
an oxide layer covering an inner surface of each of the first trenches and the second trenches; and
a nitride layer filling the second trenches,
wherein at least one of opposite topmost ends of the active patterns has a stepwise portion, wherein
the stepwise portion comprises of a bottom surface and a side surface, and the bottom surface is parallel to a top surface of the active pattern,
the oxide layer is interposed between inner side surfaces of the second trenches and a side surface of the nitride layer,
the oxide layer is interposed between bottom surfaces of the second trenches and a bottom surface of the nitride layer,
the oxide layer and the nitride layer conform an insulating pattern,
the insulating pattern fully covers bottom surfaces, top surfaces, and inner side surfaces of the plurality of trenches such that is in continuous contact with the bottom surfaces, top surfaces, and inner side surfaces of the plurality of trenches and the bottom surface and side surface of the stepwise portion, and
the insulating pattern covers has a planar top surface that covers a top surface of the active patterns and a top surface of the plurality of trenches.

12. The semiconductor device of claim 11, wherein
the active patterns are parallel to each other and are spaced apart from each other in a first direction, the first direction parallel to a top surface of the substrate, and
a distance between a topmost surface of the active patterns and bottom surfaces of the plurality of trenches is greater than a distance between a bottom step of the stepwise portion and the bottom surfaces of the plurality of trenches.

13. The semiconductor device of claim 12, wherein a width of the bottom surfaces of the second trenches in the first direction is greater than a width of bottom surfaces of the first trenches in the first direction.

14. The semiconductor device of claim 11, wherein the stepwise portion has a shape which is recessed or is concave toward an inner portion of each active pattern compared with a side surface of each active pattern.

15. The semiconductor device of claim 14, wherein the shape of the stepwise portion is concave toward the inner portion of each active pattern compared with the side surface of each active pattern.

16. The semiconductor device of claim 14, wherein the shape of the stepwise portion is recessed toward the inner portion of each active pattern compared with the side surface of each active pattern.

* * * * *